(12) United States Patent
Yang

(10) Patent No.: US 10,309,007 B2
(45) Date of Patent: Jun. 4, 2019

(54) APPARATUS FOR SPUTTERING AND OPERATION METHOD THEREOF

(71) Applicant: Beijing NAURA Microelectronics Equipment Co., Ltd., Beijing (CN)

(72) Inventor: Yujie Yang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 600 days.

(21) Appl. No.: 14/938,335

(22) Filed: Nov. 11, 2015

(65) Prior Publication Data

US 2017/0114446 A1 Apr. 27, 2017

(30) Foreign Application Priority Data

Oct. 27, 2015 (CN) .......................... 2015 1 0711965

(51) Int. Cl.
*C23C 14/34* (2006.01)
*C23C 14/35* (2006.01)
(Continued)

(52) U.S. Cl.
CPC .......... *C23C 14/35* (2013.01); *C23C 14/0641* (2013.01); *C23C 14/3414* (2013.01); *H01J 37/3405* (2013.01); *H01J 37/347* (2013.01); *H01J 37/3408* (2013.01); *H01J 37/3429* (2013.01); *H01J 37/3452* (2013.01); *H01L 21/2855* (2013.01)

(58) Field of Classification Search
CPC . C23C 14/35; C23C 14/0641; C23C 14/3414; H01J 37/3405; H01J 37/3408; H01J 37/3429; H01J 37/3452; H01J 37/347
See application file for complete search history.

(56) References Cited

U.S. PATENT DOCUMENTS

| | | | |
|---|---|---|---|
| 4,995,958 A | * | 2/1991 | Anderson ........... H01J 37/3408 204/298.2 |
| 5,314,597 A | | 5/1994 | Harra |

(Continued)

FOREIGN PATENT DOCUMENTS

| | | |
|---|---|---|
| CN | 1997768 A | 7/2007 |
| CN | 102789938 A | 11/2012 |

(Continued)

OTHER PUBLICATIONS

Search Report from Taiwan Patent Office in the counterpart Taiwnese application No. 104143327 dated Aug. 11, 2016 in Chinese.

(Continued)

*Primary Examiner* — John J Brayton
(74) *Attorney, Agent, or Firm* — Anova Law Group, PLLC

(57) ABSTRACT

Some embodiments of the present disclosure provide a sputtering apparatus including a magnetron structure configured to erode a target according to a predetermined erosion rate profile symmetric to a central axis of the magnetron structure. The predetermined erosion rate profile includes a first peak rate in proximity to the central axis; and a second peak rate located at about from 0.7 to 0.75 of a radius of the target from the central axis.

21 Claims, 32 Drawing Sheets

(51) Int. Cl.
*H01J 37/34* (2006.01)
*C23C 14/06* (2006.01)
*H01L 21/285* (2006.01)

(56) References Cited

U.S. PATENT DOCUMENTS

| | | |
|---|---|---|
| 5,417,833 A | 5/1995 | Harra et al. |
| 7,186,319 B2 | 3/2007 | Yang et al. |
| 2006/0144703 A1* | 7/2006 | Yang .................. H01J 37/3405 204/298.16 |
| 2013/0105309 A1* | 5/2013 | Mizuno ............... H01J 37/3408 204/298.08 |

FOREIGN PATENT DOCUMENTS

| | | |
|---|---|---|
| CN | 103177916 A | 6/2013 |
| CN | 103177916 A | 6/2013 |
| CN | 103177917 A | 6/2013 |
| CN | 103882394 A | 6/2014 |
| CN | 103887130 A | 6/2014 |
| CN | 104810228 A | 7/2015 |
| TW | 200624582 A | 1/1998 |

OTHER PUBLICATIONS

Office Action from the Taiwan Patent Office in the counterpart Taiwanese application No. 104143327 dated Aug. 16, 2016.
Office Action and search report dated Jul. 30, 2018, issued in counterpart Chinese Patent Application No. 201510711965.6, 11 pages in Chinese, and 2 pages English translation.

\* cited by examiner

APPARATUS FOR SPUTTERING AND OPERATION METHOD THEREOF

FIELD

The present disclosure relates to an apparatus for sputtering and an operation method of said apparatus.

BACKGROUND

Sputtering is a commonly used manufacturing process to deposit layers of metals and related materials in the fabrication of semiconductor integrated circuits and is also used for depositing coatings of materials onto other types of panels.

A sputtering apparatus includes a magnetron with permanent magnet of opposite magnetic polarity. The magnetron includes various forms or patterns to form suitable deposition of metals or other materials on a wafer or other types of panels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
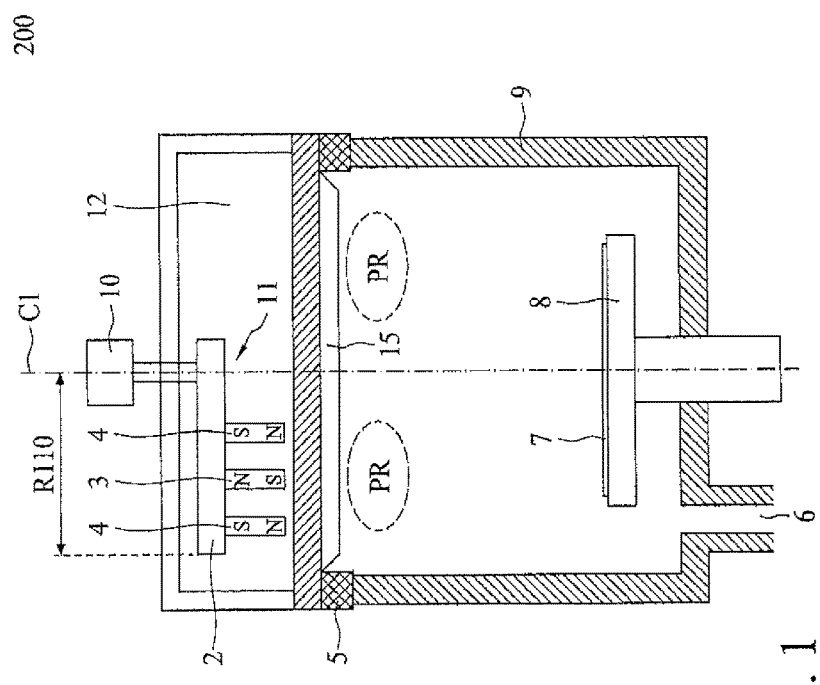
FIG. 1 is a cross-sectional view of an apparatus, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a sputtering chamber 200 including a vacuum chamber 9 is positioned symmetrically about a central axis C1. A vacuum exhaust 6 expels waste product out of the vacuum chamber 9 to maintain a low pressure in a predetermined pressure range. An argon gas source 5 connected to the vacuum chamber 9 supplies argon into the vacuum chamber 9 to hit a target 15. A pedestal 8 is positioned symmetric about the central axis C1 holds a wafer 7 or other substrate to be sputtered.

Target 15 is disposed opposite to the pedestal 8. Target 15 is over the wafer 7 and the pedestal 8. Target 15 is composed of a metallic material to be deposited on the wafer 7, for example, titanium nitride (TiN), aluminum, or titanium. The target 15 is electrically biased to a negative or positive voltage such that the argon of opposite charge is attracted to a biased target 15 and sputter atoms from target 15. Some target materials sputtered from target 15 fall upon the wafer 7 and deposit a layer of the target materials on the wafer 7. In some embodiments, in reactive ion sputtering, a reactive gas such as gas nitrogen or oxygen is additionally introduced to the vacuum chamber 9 to facilitate the deposition of a metal nitride or oxide. In some embodiments, the pedestal 8 is electrically biased opposite to a bias of target 15.

Figure 4:
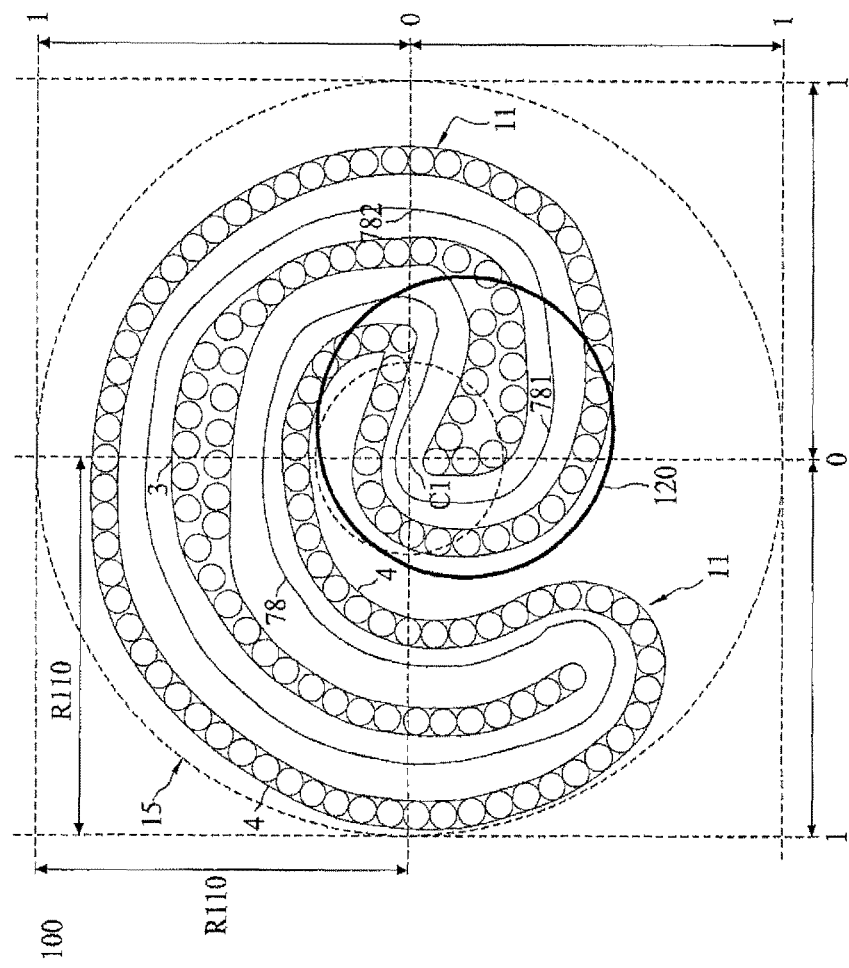
FIGS. 4 to 7 are top views of a target, in accordance with some embodiments of the present disclosure.

A magnetron structure 11 is disposed over the target 15. The magnetron structure 11 is in various shapes and forms. Magnetron structure 11 includes magnets 4 or 3 of opposed magnetic polarities. Magnets 4 or 3 are permanent magnet in a continuous shape of a closed band. Magnet 4 is an outer pole and magnet 3 is an inner pole. The magnets 4, 3 in a pattern 100 as shown in FIG. 4 confine a high-density plasma region PR proximately below the target 15. The pattern 100 of magnets 4, 3 forms magnetic field extending downward below target 15 to keep plasma in the high-density plasma region PR and trapping ions in front of the target 15, thereby increasing a plasma density in the high-density plasma region PR. An increased plasma density increases a sputtering rate on the target 15 near the high-density plasma region PR. An increased sputtering rate increases a rate of etching the target 15 such that a profile of a thickness of the target 15 includes a thinner portion proximately above the high-density plasma region PR. A current loop within the plasma is kept inside the high-density plasma region PR and leakage of plasma out of the high-density plasma region PR is prevented.

Magnetron structure 11 is positioned asymmetrically about the central axis C1. Magnetron structure 11 includes radii R110 from central axis C1 to an outer edge of magnetron structure 11. Magnetron structure 11 couples to a shaft 10 extending along the central axis C1. Shaft 10 rotates about the central axis C1 such that magnetron structure 11 spins about central axis C1 and sweeps across a region above target 15. The region is in a shape of a circle with radii R110 and a center at central axis C1. Magnetron structure 11 includes a plate 2 fixed to and rotated by the shaft 10. Plate 2 supports the magnets 3, 4 so that the magnetron structure 11 rotates about the central axis C1 and produces an azimuthally uniform time-averaged magnetic field below target 15. In some embodiments, the plate 2 includes a magnetic material to magnetically couple magnets 3, 4, or to a shaft 10.

Figure 2:
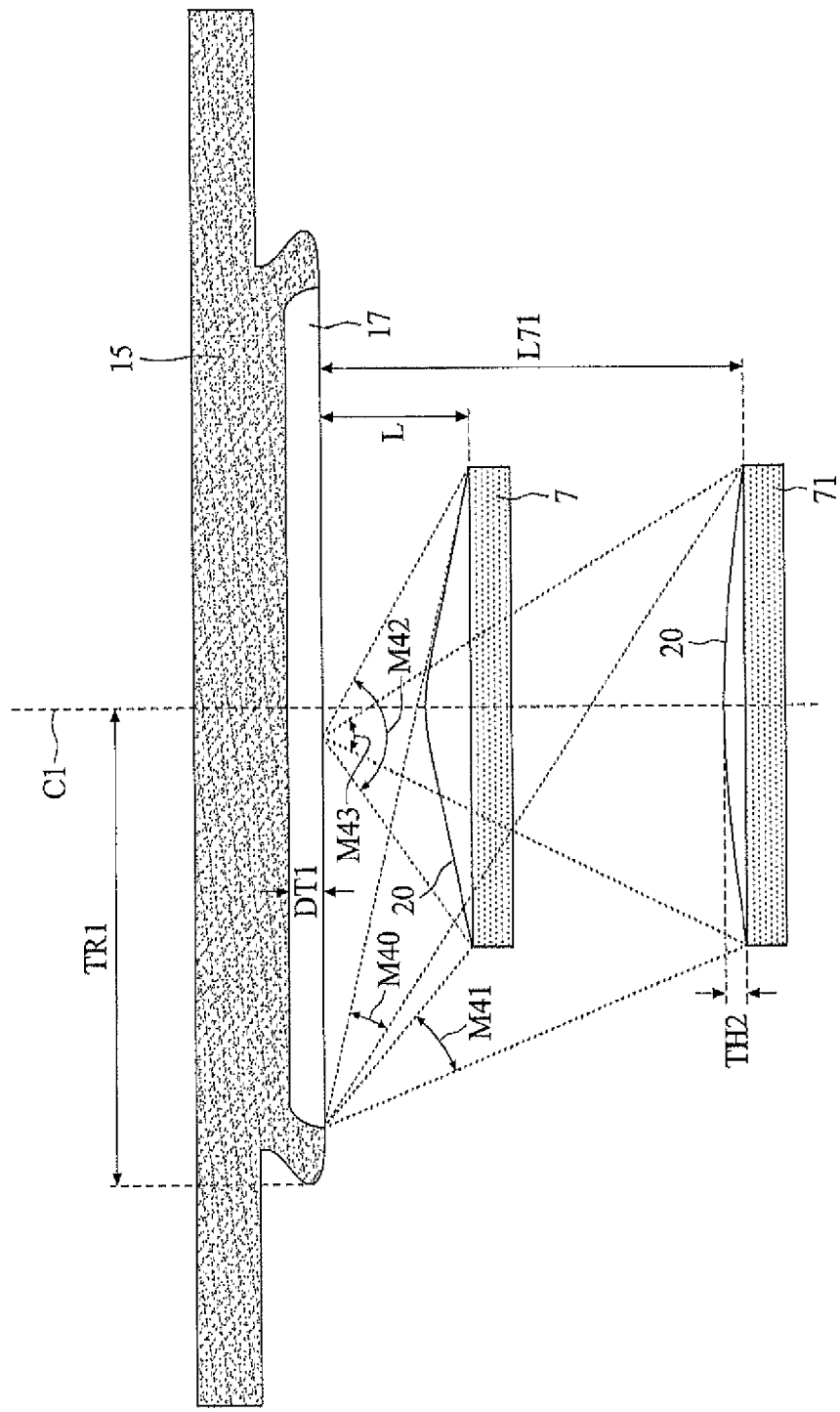
FIG. 2 is a cross-sectional view of a target, in accordance with some embodiments of the present disclosure.

In FIG. 2, wafer 7 is positioned under target 15 by a predetermined length L. Length L is variable. In some embodiments, wafer 7 is positioned from target 15 at length L of about 40 to 70 millimeters. Target 15 includes a recess 17 being etched away by sputtering operation. Target 15 includes radii TR1. For wafer 7 positioned at shorter length L, ions sputtered off from target 15 near central axis C1 are projected to wafer 7 at a degree of angle M42. Whereas ions sputtered off from target 15 near a perimeter of target 15 are projected to wafer 7 at a degree of angle M40. Degree of angle M40 is smaller than degree of angle M42. For recess 17 with substantially constant depth DT1 throughout target 15, more ions deposit on to wafer 7 near central axis C1 than around edge of wafer 7. More deposition near central axis C1 than around edge of wafer 7 results in thicker deposition near central axis C1 than around edge of wafer 7. To achieve better thickness uniformity across the wafer, an etching rate at the perimeter of the target 15 shall be greater than that near the central axis C1 in order to compensate the corresponding deposition deficiency at the perimeter of the wafer.

For wafer 71 positioned at longer length L71, proximate to central axis C1, ions sputtered off from target 15 are projected to wafer 71 at a degree of angle M43. Degree of angle M43 is smaller than degree of angle M42. Wafer 71 positioned further from target 15 receives fewer ions deposit to wafer 71 near central axis C1. For wafer 71 positioned at longer length L71 and proximately to the perimeter of target 15, ions sputtered off from target 15 are projected to wafer 71 at a degree of angle M41. Degree of angle M41 is larger than degree of angle M40. Wafer 71 positioned further from target 15 receives more ions deposit than wafer 71 around edges of wafer 71. For recess 17 including a substantially constant depth DT1, wafer 71 positioned further from target 15 receives more deposition around the edge than near central axis C1. Etching more portion of target 15 around the perimeter than near central axis C1 compensates for a reduced deposition around edge of wafer 71.

With shorter length L, difference between deposition near central axis C1 and around edge of wafer 7 is larger than wafer 71 with longer length L71, wafer 71 includes greater uniformity than wafer 7.

Deposited layer 20 of the target material includes a thickness TH2 on wafer 7. The target material includes a resistivity. Deposited layer 20 of the target materials also includes a sheet resistance. The resistivity is a product of thickness TH2 and the sheet resistance. In some embodiments, the target material on wafer 7 includes different resistivity at different location of the wafer 7. For a constant thickness TH2, sheet resistance and resistivity changes proportionally at different location of the wafer 7. For example, the deposited layer 20 includes TiN. For a constant thickness TH2, sheet resistance of the deposited TiN film is lower around the edge of wafer 7 than that near a center of wafer 7. Magnetron structure 11 adjusts a profile of erosion rate across target 15 to control a uniformity of the thickness TH2 at different location on wafer 7. For example, the thickness TH2 of deposited layer 20 is varying to maintain a uniformity of the sheet resistance of deposited layer 20. The sheet resistance of the target material is kept substantially constant from the center to the edge of wafer 7 by increasing thickness TH2 of the deposited layer 20 from the center to the edge of wafer 7. The magnetron structure 11 in FIG. 1 controls the thickness TH2 of the deposited layer 20 from the center to the edge of wafer 7.

Figure 3:
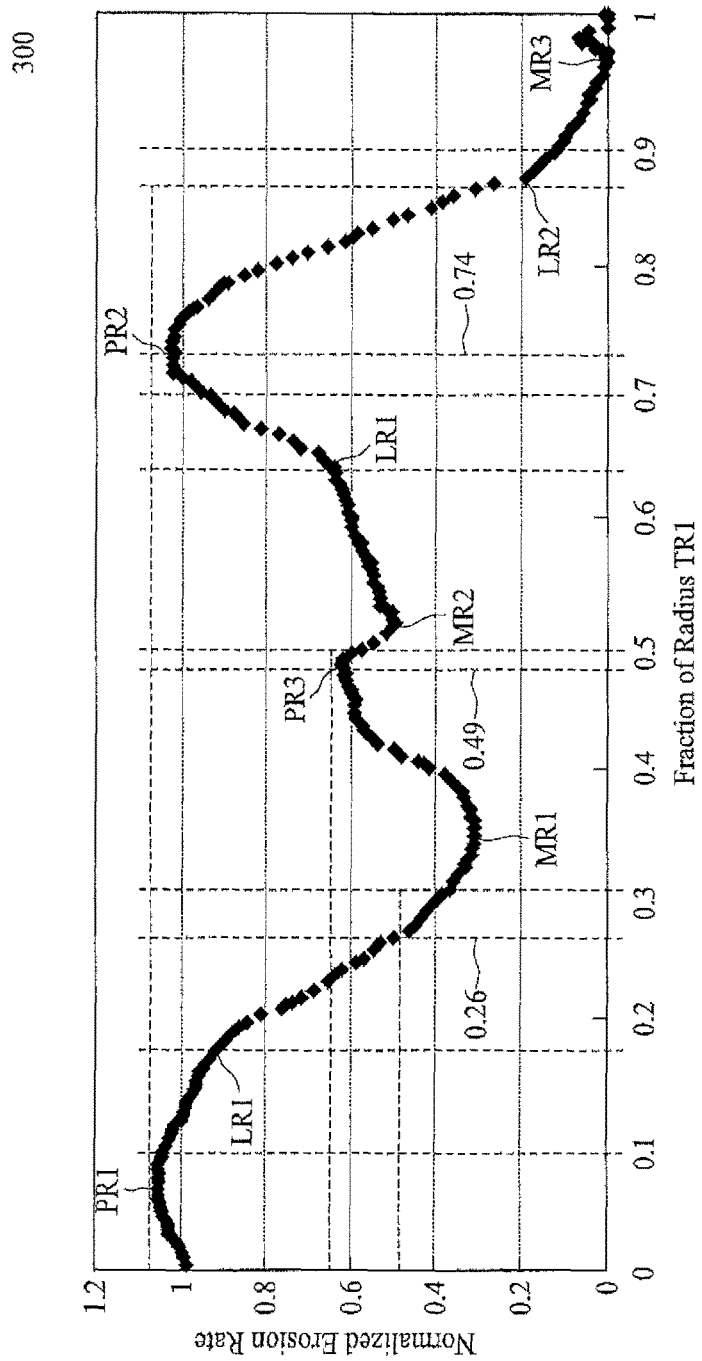
FIG. 3 illustrates a relationship between a fraction of a target radius and a normalized erosion rate, in accordance with some embodiments of the present disclosure.

The magnetron structure 11 guides ions toward the target 15 to erode target 15 at different rate according to a predetermined erosion rate profile 300 in FIG. 3. The predetermined erosion rate profile 300 maintains the sheet resistance of the target material substantially constant. The predetermined erosion rate profile 300 is symmetric around central axis C1 of the magnetron structure 11 as a result of a rotation of the magnetron structure 11 around the central axis C1.

The predetermined erosion rate profile 300 includes a horizontal axis representing different fraction of a radii TR1 of the target 15 from 0 to 1, with 0 at the central axis C1 and 1 at a point on the perimeter of target 15. The point is distanced from central axis C1 by radii TR1. The predetermined erosion rate profile 300 includes a vertical axis representing a normalized erosion rate with 1 being a first erosion rate at central axis C1.

The predetermined erosion rate profile 300 includes several peak rates. The peak rate is a local maximum of a curve of predetermined erosion rate profile 300. A slope of the curve at the peak rate is proximately zero. For example, a first peak rate PR1 includes around 1.1 of the first erosion rate. The first peak rate PR1 is located at about 0.1 of the radii TR1. The second peak rate PR2 is substantially 1.1 of the first erosion rate. The second peak rate PR2 is located at about a range from 0.7 to 0.75 of the radii TR1. The first peak rate PR1 is substantially equal to the second peak rate PR2. A minor peak rate PR3 includes around 0.6 of the first erosion rate. The minor peak rate PR2 is located at about a range from 0.4 to 0.5 of the radii TR1. The minor peak rate PR3 is substantially less than the second peak rate PR2.

The predetermined erosion rate profile 300 includes some minimum rates from central axis C1 to the perimeter. The minimum rate is a local minimum of a curve of predetermined erosion rate profile 300. A slope of the curve at the minimum rate is proximately zero. A first minimum rate MR1 is substantially 0.3 of the first erosion rate. The first minimum rate MR1 is located at about a range from 0.3 to 0.4 of the radii TR1. A second minimum rate MR2 is substantially 0.5 of the first erosion rate. The second minimum rate MR2 is located at about a range from 0.5 to 0.55 of the radii TR1. A third minimum rate MR3 is substantially 0.01 of the first erosion rate. The third minimum rate MR3 is located at about a range from 0.9 to 0.99 of the radii TR1.

The predetermined erosion rate profile 300 includes some altering rates from central axis C1 to the perimeter. The altering rate is a change in a slope of a curve of predetermined erosion rate profile 300. For example, the change in slope includes a changing from a gradual positive slope to a steep positive slope. A first altering rate LR1 is at substantially 0.6 of the first erosion rate. The first altering section LR1 is located at about a range of from 0.6 to 0.7 of the radii TR1. The slopes of the first altering section LR1 changes from a gradual positive slope to a steep positive slope. The slope before 0.63 of the radii TR1 is gradually rising. The slope after 0.63 of the radii TR1 is steeply rising. A second altering rate LR2 is at substantially 0.2 of the first erosion rate. The second altering rate LR2 is located at about a range from 0.8 to 0.9 of the radii TR1. The second altering rate LR2 is a changing from a steep negative slope to a gradual negative slope. The slope before second altering rate LR2 is steeply decreasing. The slope after second altering rate LR2 is gradually decreasing.

The magnetron structure 11 in FIG. 1 is designed to generate a predetermined erosion rate profile 300 as shown in FIG. 3 by guiding most of the ions to collide around an incident location 78 as illustrate in FIG. 4. Incident location 78 is an imaginary construct between inner pole 3 and outer 4 of magnetron structure 11 according to some embodiments of the present disclosure. High energy ions concentrate between inner pole 3 and outer pole 4 and thus the incident location 78 marks the location where the vigorous collision of the ions to the target occurs. The incident locations 78 are proximately in a shape of a closed band swirling around central axis C1. The incident locations 78 are proximately superimposed on magnetron structure 11. Target 15 is scaled from zero at central axis C1 to 1 at the perimeter of target 15 at radii TR1. A boundary 120 is drawn enclosing central axis C1. Boundary 120 includes a central portion 781 of incident location 78 near central axis C1. The central portion 781 is a terminal portion of incident location 78. Peripheral portion 782 is a portion of incident location 78 outside of boundary 120. Boundary 120 is proximately a circular shape.

Figure 5:
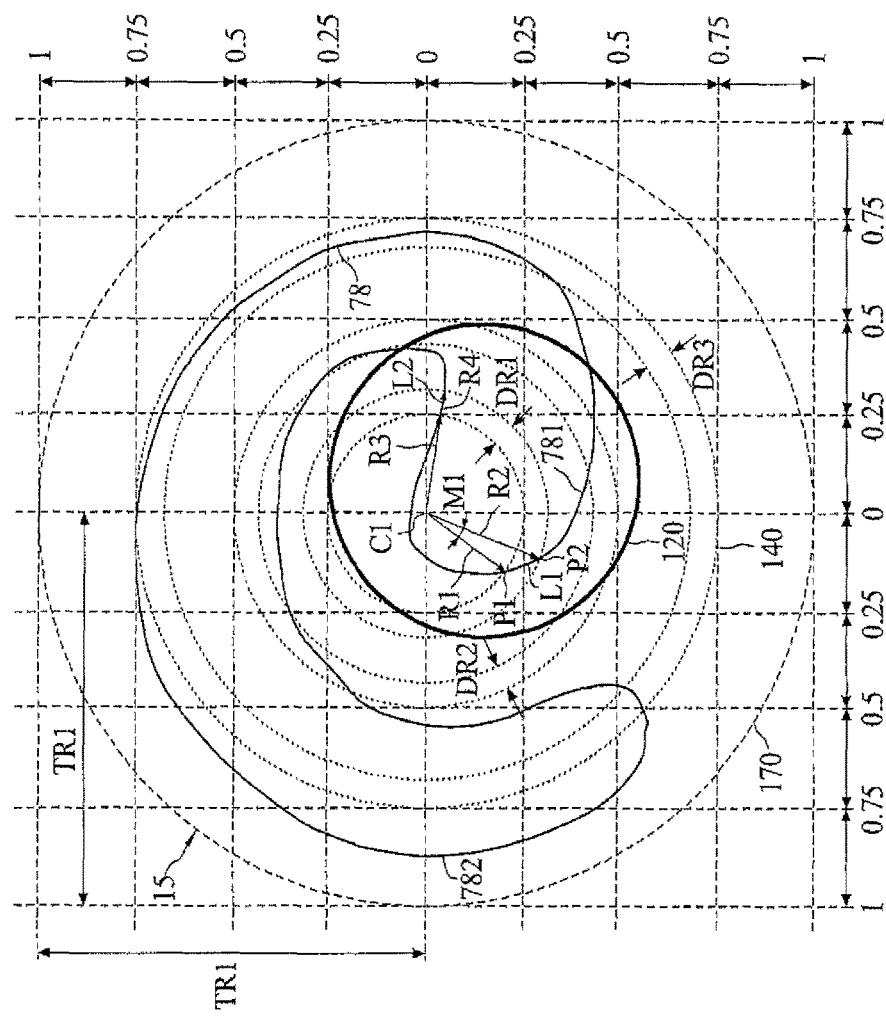

In FIG. 5, a vector R1 is drawn from central axis C1 to a first point P1 on the incident location 78 inside boundary 120. A vector R2 is drawn from central axis C1 to a second point P2 on the incident location 78. Vector R2 is greater than vector R1 by a radial increment DR1. Radial increment DR1 is a distance between two concentric circles with radius at around 0.26 of radii TR1. A first portion L1 of incident location 78 is from the first point P1 to the second point P2. Following the first portion L1 is a change in an azimuthal direction by a degree of angle M1. Degree of angle M1 is a degree of angle between vector R1 and vector R2.

A vector R3 is drawn from central axis C1 to a third point on the incident location 78 inside boundary 120. A vector R4 is drawn from central axis C1 to a fourth point on the incident location 78. Vector R4 is greater than vector R3 by the radial increment DR1. A second portion L2 of incident location 78 is from the third point to the fourth point. Following the second portion L2, a change in a radial direction from vector R3 to R4 is accompanied by a change in an azimuthal direction of nearly zero. Vector R3 and R4 are nearly overlapping with each other.

Figure 6:
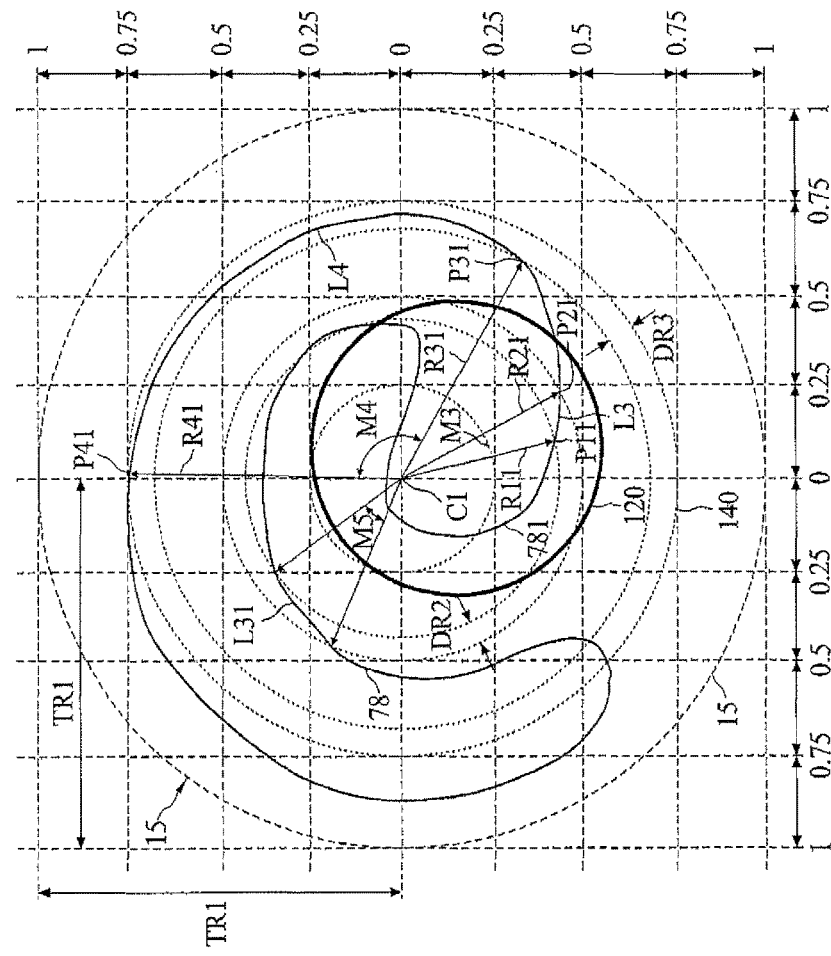

In FIG. 6, within the boundary 120, a vector R11 is drawn from central axis C1 to a point P11 on the central portion 781. A vector R21 is drawn from central axis C1 to a point P21 on the central portion 781. Vector R21 is greater than vector R11 by a radial increment DR2. Radial increment DR2 is between two concentric circles with radius at around 0.49 of radii TR1. A length L3 is measured along incident location 78 from the point P11 to the point P21. Length L3 is a loop length of a segment on incident locations 78 between the point P11 and the point P21. Along the segment, a change in a radial direction by radial increment DR2 is accompanied by a variation in azimuthal direction by a degree of angle M3 inside boundary 120. Outside of boundary 120, peripheral portion 782 includes another variation in the azimuthal direction is by a degree of angle M5. A tangential portion points in azimuthal direction. The tangential portion is tangential to a circle centering at the central axis C1. A radial portion points in radial direction. Peripheral portion 782 includes more tangential portion than central portion 781. Central portion 781 includes more radial portion than peripheral portion 782. Peripheral portion 782 includes longer loop length than central portion 781. A total variation in the azimuthal direction for radial increment DR2 is a summation of degree of angle M5 and M3. Radial increment DR1 in FIG. 5 is substantially equal to radial increment DR2 in FIG. 6. The summation of degree of angle M5 and M3 in FIG. 6 is larger than degree of angle M1 in FIG. 5. In FIG. 3, the normalized erosion rate at around 0.49 of radii TR1 is larger than the normalized erosion rate at around 0.26 of radii TR1. The normalized erosion rate at around 0.49 of radii TR1 is the minor peak rate PR3.

In FIG. 6, a vector R31 is drawn from central axis C1 to a point P31 on the incident locations 78 outside of the boundary 120. A vector R41 is drawn from central axis C1 to a point P41 on the incident locations 78. Vector R41 is greater than vector R31 by a radial increment DR3. Radial increment DR3 is between two concentric circles with radius at around from 0.7 to 0.75 of radii TR1. Following a segment of incident locations 78 from point P31 to point P41, a change in a radial direction by radial increment DR3 is accompanied by a change in an azimuthal direction by a degree of angle M4. Radial increment DR3 is substantially equal to radial increment DR2. Degree of angle M4 is proximately around 120 degree. The degree of angle M4 is substantially larger than a sum of degree of angle M5 and M3. In FIG. 3, the normalized erosion rate at around from 0.7 to 0.75 of radii TR1 is substantially larger than the normalized erosion rate at around 0.49 of radii TR1. The normalized erosion rate at around from 0.7 to 0.75 of radii TR1 is the second peak rate PR2.

Figure 7:
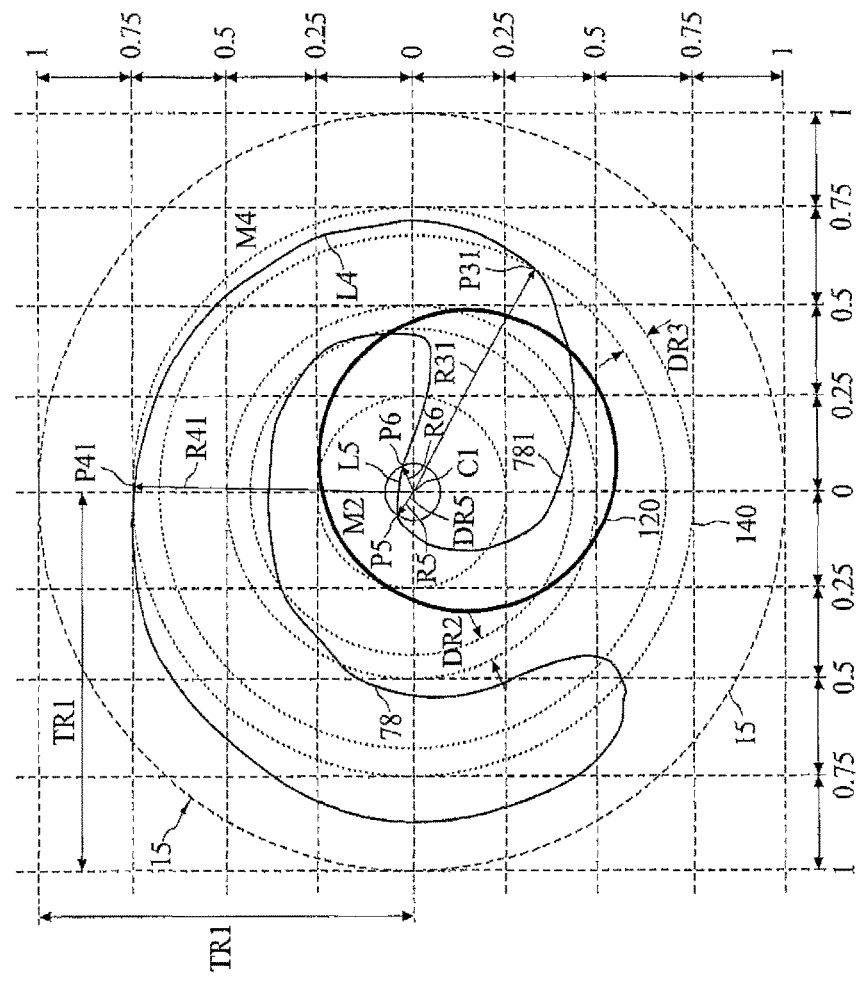

In FIG. 7, a vector R5 is drawn from central axis C1 to a point P5 on the central portion 781. A vector R6 is drawn from central axis C1 to a point P6 on the central portion 781. A length of vector R5 is substantially equal to a length of vector R6. The point P1 and the point P2 are on a same circle center at central axis C1 with radius of proximately 0.1 of radii TR1. A degree of angle M2 is between vector R5 and R6. A length L5 is measured along incident location 78 from the point P5 to the point P6. Length L5 is a loop length of a segment on incident locations 78. Radial increment DR3 in FIG. 6 is substantially equal to a length of vector R5 in FIG. 7. The degree of angle M2 is proximately at around 120 degree. The degree of angle M4 is substantially equal to the degree of angle M2. In FIG. 3, the normalized erosion rate at around 0.1 of radii TR1 is substantially equal to the normalized erosion rate at around from 0.7 to 0.75 of radii TR1. The normalized erosion rate at around 0.1 of radii TR1 is the first peak rate PR1. The first peak rate PR1 is substantially equal to the second peak rate PR2 at around 1.1 of the first erosion rate.

Figure 8:
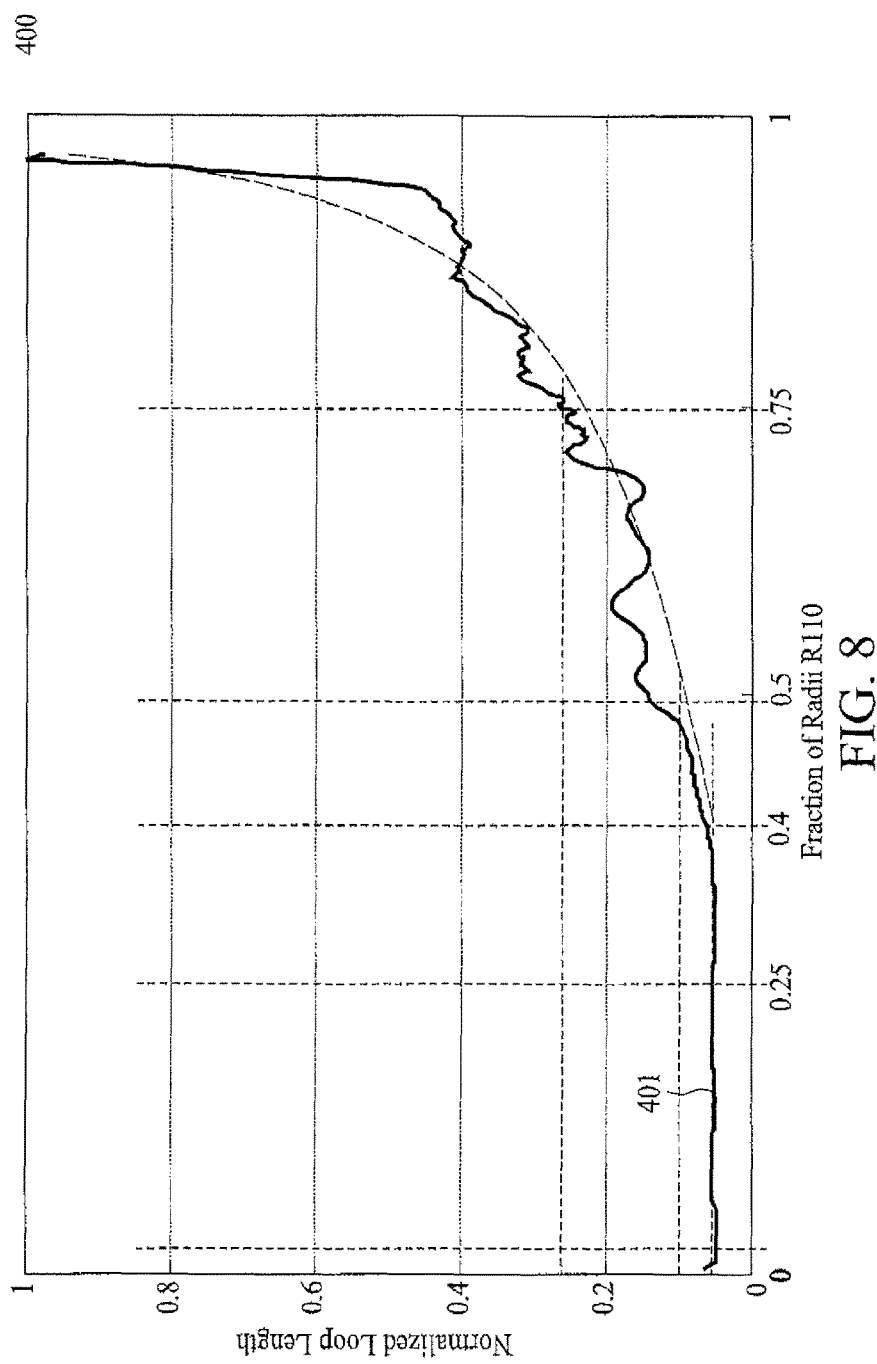
FIG. 8 illustrates a relationship between a fraction of a magnetron radius and a normalized loop length, in accordance with some embodiments of the present disclosure.

FIG. 8 illustrates a normalized loop length profile 400. The normalized loop length profile 400 is in accordance with the incident location 78 shown in FIG. 4 and the predetermined erosion rate profile 300 shown in FIG. 3.

The normalized loop length profile 400 includes a horizontal axis representing different fraction of a radii R110 of the magnetron structure 11 from 0 to 1, with 0 at the central axis C1 and 1 at the radii R110. The normalized loop length profile 400 includes a vertical axis representing a normalized loop length with 1 being a maximum loop length at radii in proximity to radii R110.

An integration of a loop length of the incident locations 78 between predetermined ranges of radius matches with the normalized loop length at said predetermined range of radius. In some embodiments, as shown in FIG. 5, the predetermined range is the radial increment DR1. Radial increment DR1 contains approximately a degree of angle M1. Radial increment DR1 encloses some sections of loop length L1 and L2 of the incident location 78. A summation of loop length L1 and L2 is a total loop length within the radial increment DR1. The total loop length within the radial increment DR1 corresponds to the normalized loop length at around 0.25 of R110 in FIG. 8.

In FIG. 6, radial increment DR2 contains approximately a degree of angle M5 and M3. Radial6, radial increment DR2 encloses several sections of loop length L3 and L31 of the incident location 78. A summation of loop length L3 and L31 is substantially larger than a sum of loop length L1 and L2 in FIG. 5. The summation of loop length L3 and L31 corresponds to the normalized loop length at around 0.5 of R110 in FIG. 8. The normalized loop length at around 0.5 of R110 is substantially larger than the normalized loop length at around 0.25 of R110 in FIG. 8.

In FIG. 7, radial increment DR3 contains approximately a degree of angle M4. Radial7, radial increment DR3 encloses a section of loop length L4 of the incident location 78. Loop length L4 is substantially larger than a sum of loop length L3 and L31 in FIG. 6. The loop length L4 corresponds to the normalized loop length at around 0.75 of R110 in FIG. 8. The normalized loop length at around 0.75 of R110 is substantially larger than the normalized loop length at around 0.5 of R110 in FIG. 8.

In FIG. 7, a radial increment DR5 is defined from central axis C1 to point P5. Radial increment DR5 contains approximately a degree of angle M2. Radial increment DR5 encloses some sections of loop length L5 of the incident location 78. A loop length L5 is substantially equal to the sum of L1 and L2 in FIG. 5. The loop length L5 corresponds to the normalized loop length at around 0.01 of R110 in FIG. 8.

A loop length L5 shown in FIG. 7 is substantially equal to the sum of L1 and L2 in FIG. 5. A loop length L5 is substantially equal to the loop length L3 in FIG. 6. A terminal portion of the incident location 78 is enclosed by the boundary 120. Inside the boundary 120, each total loop length within each radial increment DR5, DR1, and DR2 are substantially equal. Radial increment DR5, DR1, and DR2 are different annular rings with substantially the same width. Inside the boundary 120, total loop length of any of the aforesaid radial increment remains constant.

Referring back to FIG. 8, a normalized loop length is substantially constant for radius of less than around 0.4 of radii R110. The normalized loop length is substantially constant at a quantity of 0.08. For radius beyond approximately 0.4 of radii R110, the normalized loop length substantially increases. In some embodiments, the normalized loop length calculated at the radius beyond 0.4 of radii R110 increases nonlinearly.

Figure 9:
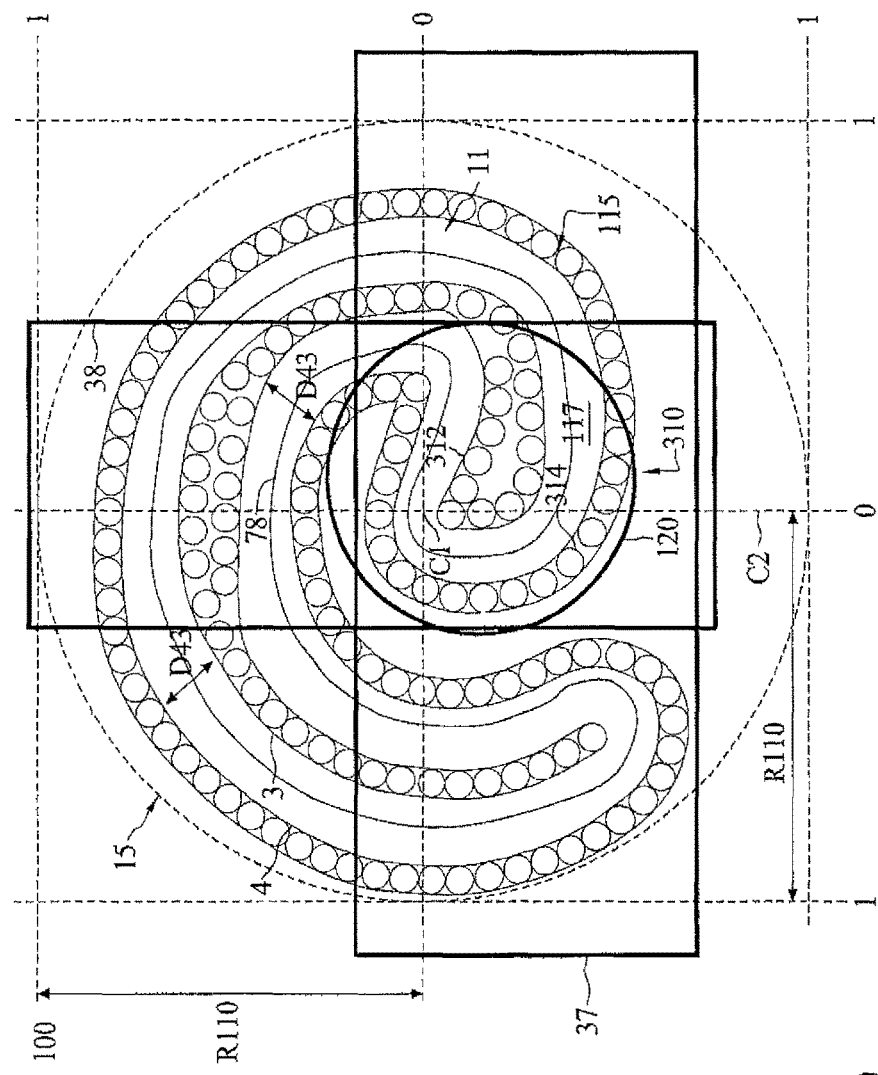
FIGS. 9 to 12 are top views of a magnetron, in accordance with some embodiments of the present disclosure.

Referring to FIG. 9, the pattern 100 of magnetron structure 11 is designed to generate predetermined erosion rates at different locations on the target according to the erosion rate profile 300. The pattern 100 of magnetron structure 11 constrains the ions to erode target 15 at incident location 78. In some embodiments, magnet 3, 4 of magnetron structure 11 is arranged in the pattern 100 of magnetron structure 11.

Magnet 3 is an inner pole 3. Magnet 4 is an outer pole 4. Magnetron structure 11 includes outer pole 4 having a first magnetic polarity and inner pole 3 having a second magnetic polarity opposite to the first magnetic polarity. The inner pole 3 is surrounded by the outer pole 4. The pattern 100 includes the outer pole 4 spiraling asymmetrically around the central axis C1.

The pattern 100 is designed to decrease thickness TH2 of deposited layer 20 in FIG. 2, near central axis C1 by distributing less inner pole 3 and outer pole 4 near central axis C1. The pattern 100 is designed to increase thickness TH2 further from central axis C1 by distributing more inner pole 3 and outer pole 4 further from central axis C1. Distributing fewer magnets 3, 4 near central axis C1, in some embodiments, is by arranging magnet 3, 4 less tangentially and more radially with respect to the central axis C1. Distributing more magnet 3, 4 further from central axis C1, in some embodiments, is by arranging more magnet 3, 4 tangentially and less radially with respect to the central axis C1. For example, in some embodiments, a portion 115 of the magnetron structure 11 outside boundary 120 and being tangential to a circle centering at the central axis C1 is substantially greater than a portion 117 of the magnetron structure 11 inside the boundary 120 and being tangential to the circle. Alternatively stated, the portion 117 refers to a segment of the incident location 78 inside the boundary 120. The amount of the portion 117 being tangential to a circle is approximately constant inside the boundary 120. A constant amount of portion 117 is in accordance with flat section 401 of normalized loop length profile 400 in FIG. 8. Flat section 401 corresponds to portion 117. Portion 115 is outside the boundary 120. Portion 115 sweeps through more than 270 degree with respect to the central axis C1. Portion 115 includes a large tangential portion compare to portion 117. Portion 117 are mostly parallel with the radial direction from central axis C1. In some embodiments, boundary 120 includes a radius in a range of from about 70 millimeters to about 75 millimeters or from about 75 millimeters to about 80 millimeters. In some embodiments, boundary 120 includes a radius of from about 0.3 to about 0.4 of radii R110 of magnetron structure 11.

FIG. 9 illustrates that the inner pole 3 includes a terminal portion 312 pointing toward the central axis C1. Terminal portion 312 is in proximity to the central axis C1. The boundary 120 encloses the terminal portion 312 of the inner pole 3 and terminal portion 314 of the outer pole 4. Boundary 120 includes a circular shape surrounding the terminal portion 312 of the inner pole 3 and the terminal portion 314 of the outer pole 4. Terminal portion 312 is thicker than other parts of inner pole 3 such that distance D43 is kept constant between terminal portion 312 and terminal portion 314. Distance D43 between the inner pole 3 and the outer pole 4 is substantially constant such that outer pole 4 is substantially parallel to a contour of the incident location 78. The Incident location 78 is located between inner pole 3 and outer pole 4.

Figure 10:
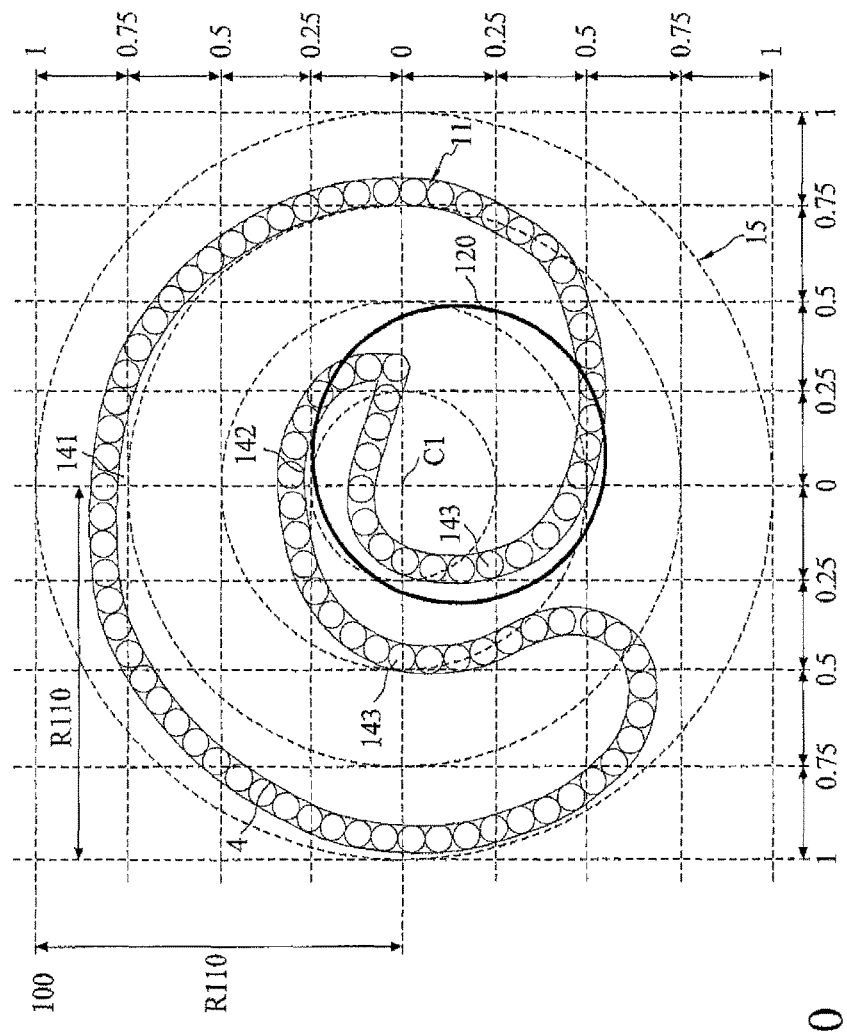

FIG. 10 illustrates only the outer pole 4 of the magnetron structure 11. An outer pole 4 includes several sections. Different sections are represented by assigning various parameters for a function of spiraling curve. For example, a general equation for each sections is provided below:

$$r = a \times \theta n + b \times (\cos \theta) m + c \times (\tan \theta) k + d,$$

where r is the section contour of the outer pole 4, and degree of angle θ is in radian with zero at a top of pattern 100. For example, the function representing section 141 is written as: r=17.54×θ0.78+5.45×(cos θ)1.12+179.42, where $0 \leq \theta \leq 1.15\pi$. For section 142, the function is written as: $r=5.84\times\theta0.72-10.86\times(\cos \theta)1.35-95.02$, where $1.02\pi \leq \theta \leq 1.65\pi$. The function for section 143 is written as: $r=6.42\times\theta1.98+1.88\times(\cos \theta)1.95+45.41$, where $0.3 \leq \theta \leq 1.14\pi$. The function for section 144 (not shown in FIG. 10) is written as: $r=3.54\times\theta1.97-42.68\times(\cos \theta)1.69-45.12$, where $0.65\pi \leq \theta \leq 1.58\pi$.

Figure 11:
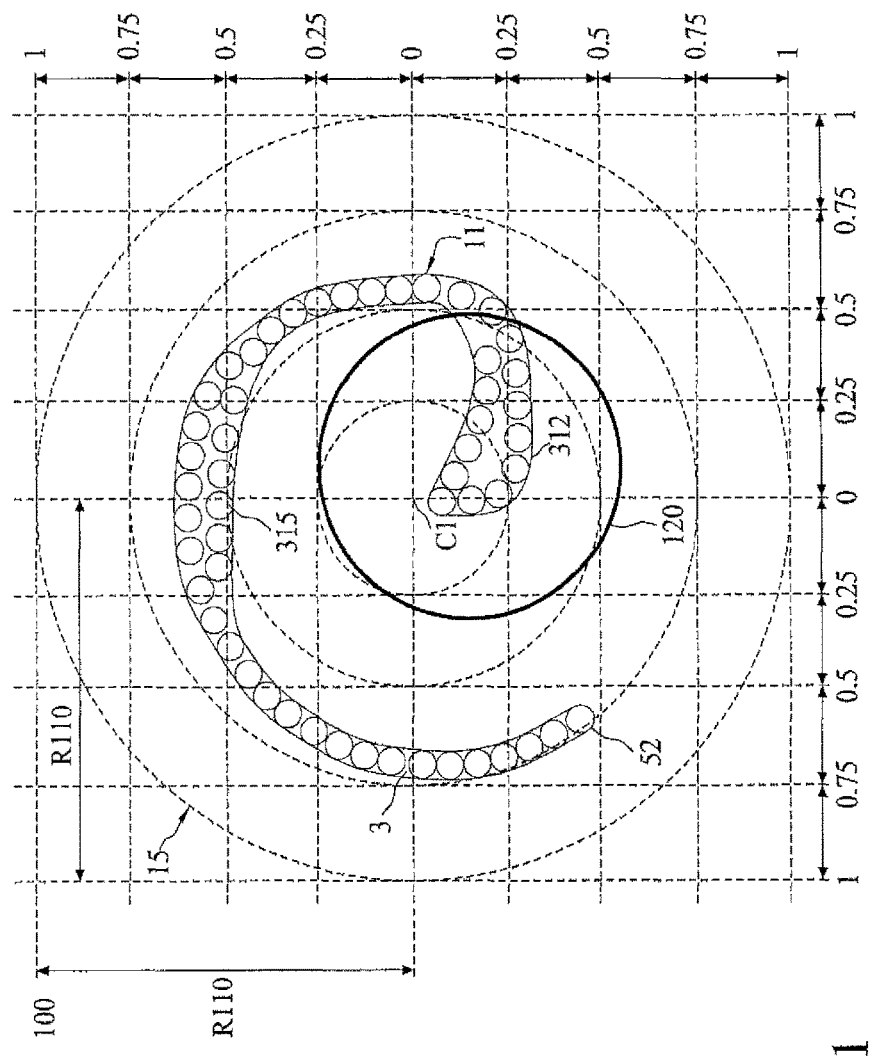

FIG. 11 illustrates only the inner pole 3 of the magnetron structure 11. An inner pole 3 includes several sections. In some embodiments, the function for section 315 is written as: $r=8.31\times\theta1.235+10.84\times(\cos \theta)1.362+39.02$, where $1.72\pi \leq \theta \leq 3.14\pi$. The function for section 312 is written as: $r=3.42\times\theta1.91+6.24\times(\cos \theta)1.56-3.41$, where $1.28\pi \leq \theta \leq 1.81\pi$.

Figure 12:
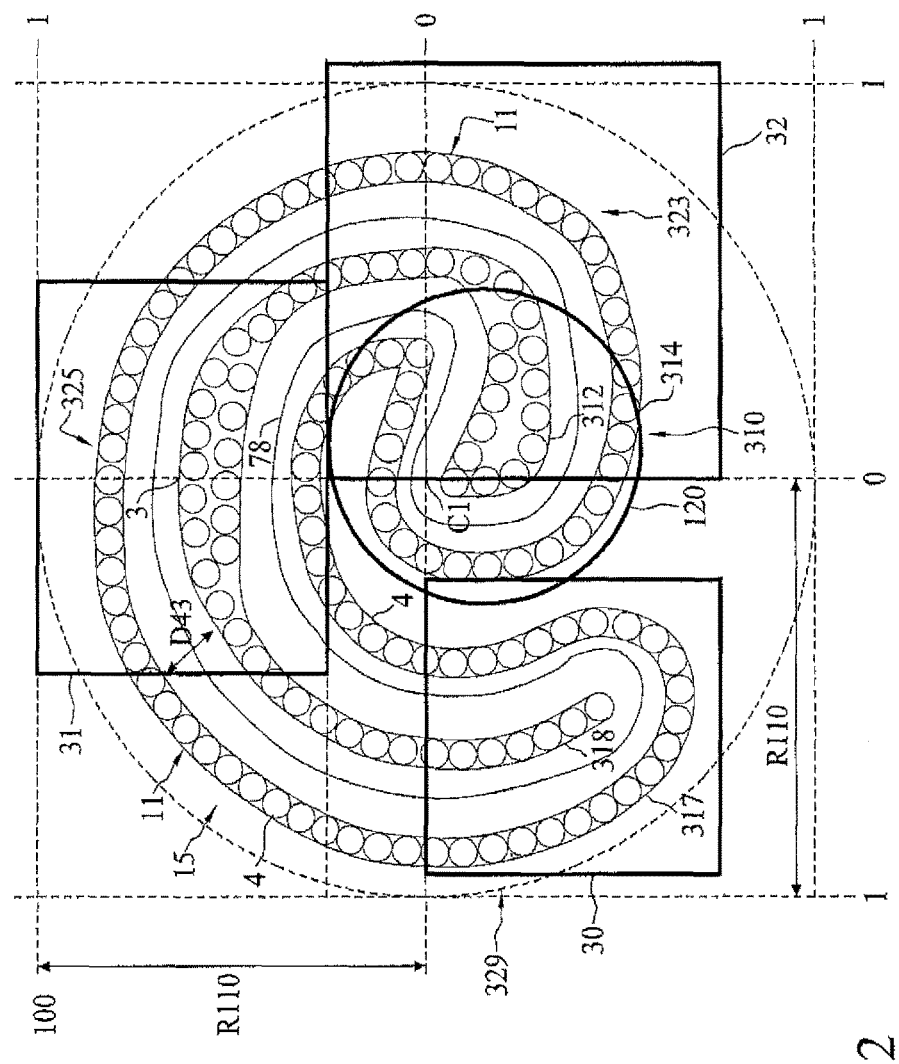

In FIG. 12, the pattern 100 of magnetron structure 11 includes outer pole 4 of a first magnetic polarity in a closed band and an inner pole 3 enclosed by the outer pole with a second magnetic polarity opposite to the first magnetic polarity. The pattern 100 includes three sections. Details of each section are discussed below. The three sections are section 30, 31, and 32.

Section 30 includes terminal portions 318 and 317 of the inner pole 3 and the outer pole 4 outside of the boundary 120. Terminal portion 317 includes a partial curve surrounding terminal portion 318 such that distance D43 is kept nearly constant. Distance D43 is a shortest distance from a point on inner pole 3 to outer pole 4.

Section 31 includes a middle portion 325 of inner pole 3 and outer pole 4. The middle portion 325 of outer pole 4 is marginally wider than a parallel portion 329 in section 30 of outer pole 4 such that the middle portion 325 of inner pole 3 is thicker than parallel portion 329 of inner pole 3 to keep distance D43 nearly constant. The parallel portion 329 is a portion in section 30 where the inner pole 3 is parallel to the outer pole 4.

Section 32 includes a portion of inner pole 3 and outer pole 4 inside boundary 120. Section 32 includes a corner portion 323 of inner pole 3 and outer pole 4. The corner portion 323 is a bending of inner pole 3 and outer pole 4 at around 90 degree angle with respect to the central axis C1. Outer pole 4 includes a sharp turn at around 0.3 of radii R110.

Figure 13:
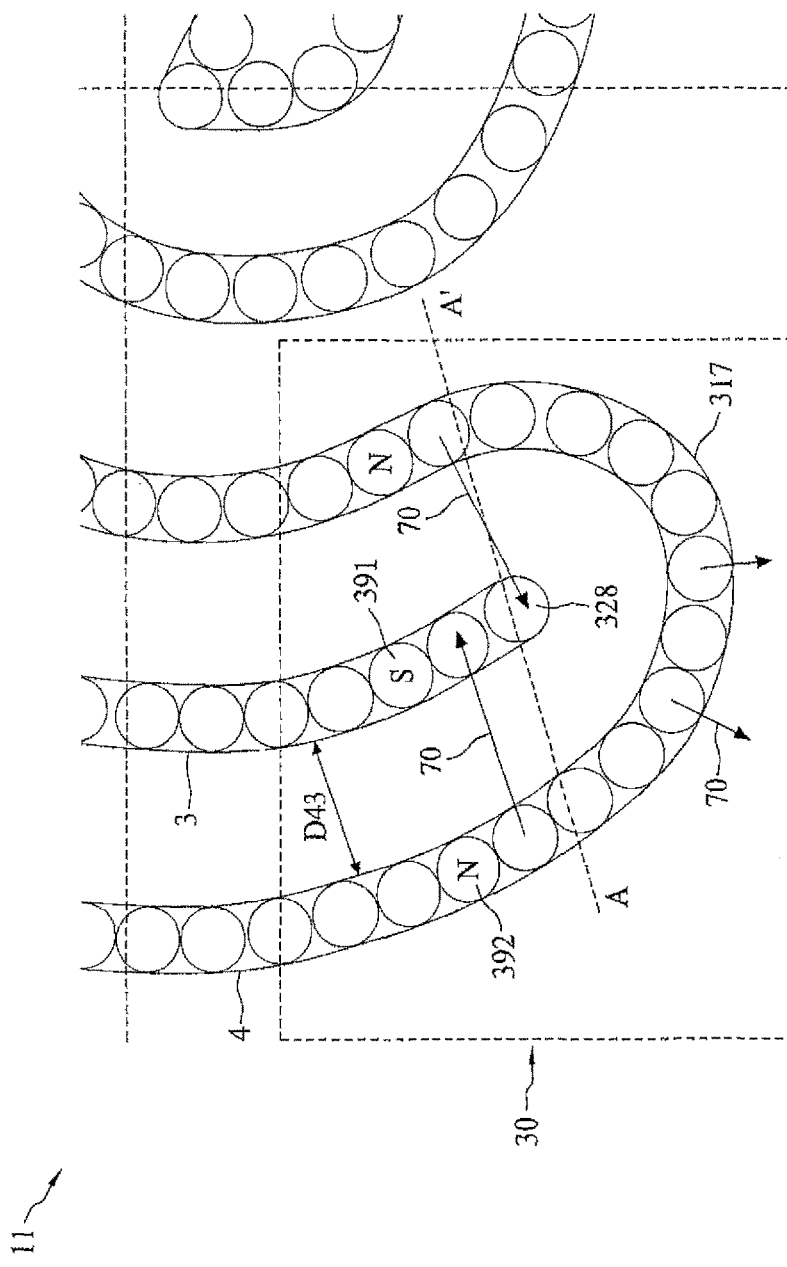
FIGS. 13, 15, 16, 18, 19, 21, 22, and 25 are enlarged views of some portions of FIG. 12 showing a magnetron, in accordance with some embodiments of the present disclosure.

In FIG. 13, section 30 is enlarged. Outer pole 4 includes a magnetic polarity of a north pole 392. Inner pole 3 includes a magnetic polarity of a south pole 391. Magnetic field line 70 crosses from a point in outer pole 4 to a point in inner pole 3. Magnetic field line 70 pointing from outer pole 4 to inner pole 3. In some embodiments, a direction of magnetic field line 70 is parallel to a direction for measuring distance D43. A length of magnetic field line 70 is proximately equal to or greater than distance D43.

Referring to FIG. 13, curvatures of inner pole 3 and outer pole 4 are nearly parallel except at a tip 328. At a parallel portion 329 in section 30, magnets of the outer pole 4 are distributed at both sides of inner pole 3, and in some embodiments, the quantity of the magnets at the parallel portion 329 of the outer pole 4 is about twice more than that of the inner pole 3. Magnetic field lines 70 are equally distributed around either side of inner pole 3. At around tip 328, magnets of outer pole 4 are distributed more than inner pole 3. Some magnets in outer pole 4 are unable to match with an opposite poles at the corresponding inner pole 3. Some unmatched magnets in outer pole 4 spread out magnetic field line 70 to other direction.

Figure 14:
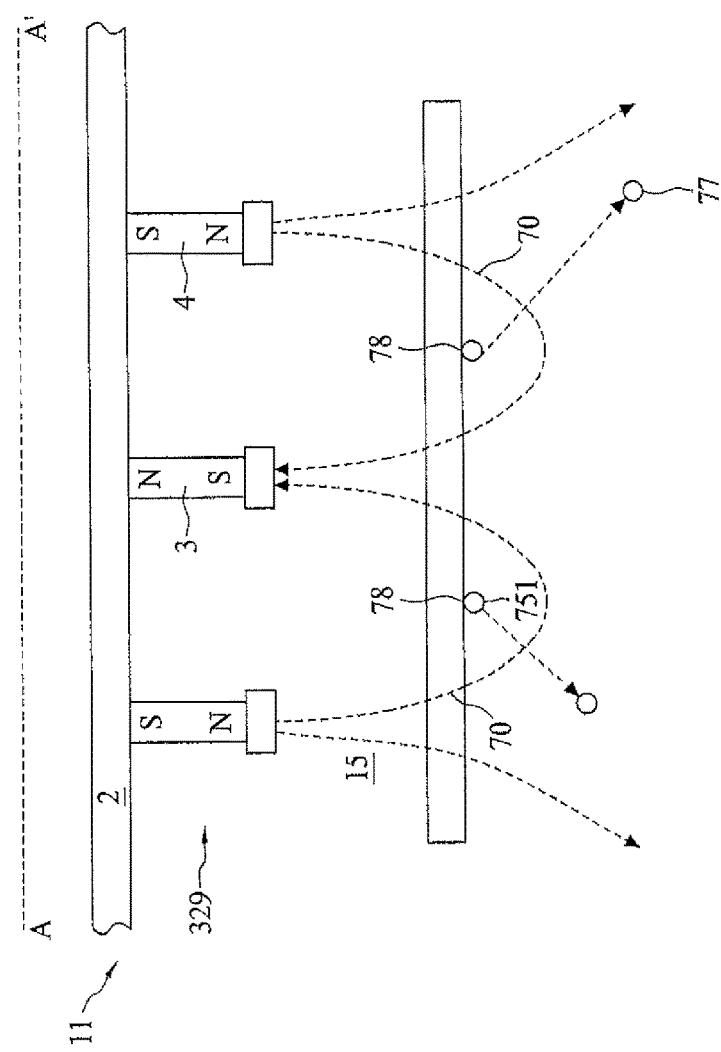
FIGS. 14, 17, 20, 23, 24, 26, and 27 are cross-sectional views of a magnetron, in accordance with some embodiments of the present disclosure.

FIG. 14 is a cross sectional view drawn from cross sectional line AA' in FIG. 13. In FIG. 14, magnetic structure 11 is disposed above the target 15. A north pole of a magnet in outer pole 4 faces toward target 15. Magnetic field line 70 from outer pole 4 extends toward inner pole 3. A portion of magnetic field line 70 extends below target 15. A number of magnets in inner pole 3 is less than a number of magnets in outer pole 4. Some excess or unmatched magnets in outer pole 4 spreads magnetic field line 70 downward to other directions.

Ions 751 in plasma follows along magnetic field line 70 towards inner pole 3. Ions 751 spin around magnetic field line 70 in a path 75. In cross sectional view, incident location 78 is a spot collided by ions 751 onto target 15. Ions 751 hit target 15 and knock out target material 77 from incident location 78. Increasing collisions of ions 751 removes more target materials 77 and result in some recess or grooves left on target 15 near the incident location 78.

Figure 15:
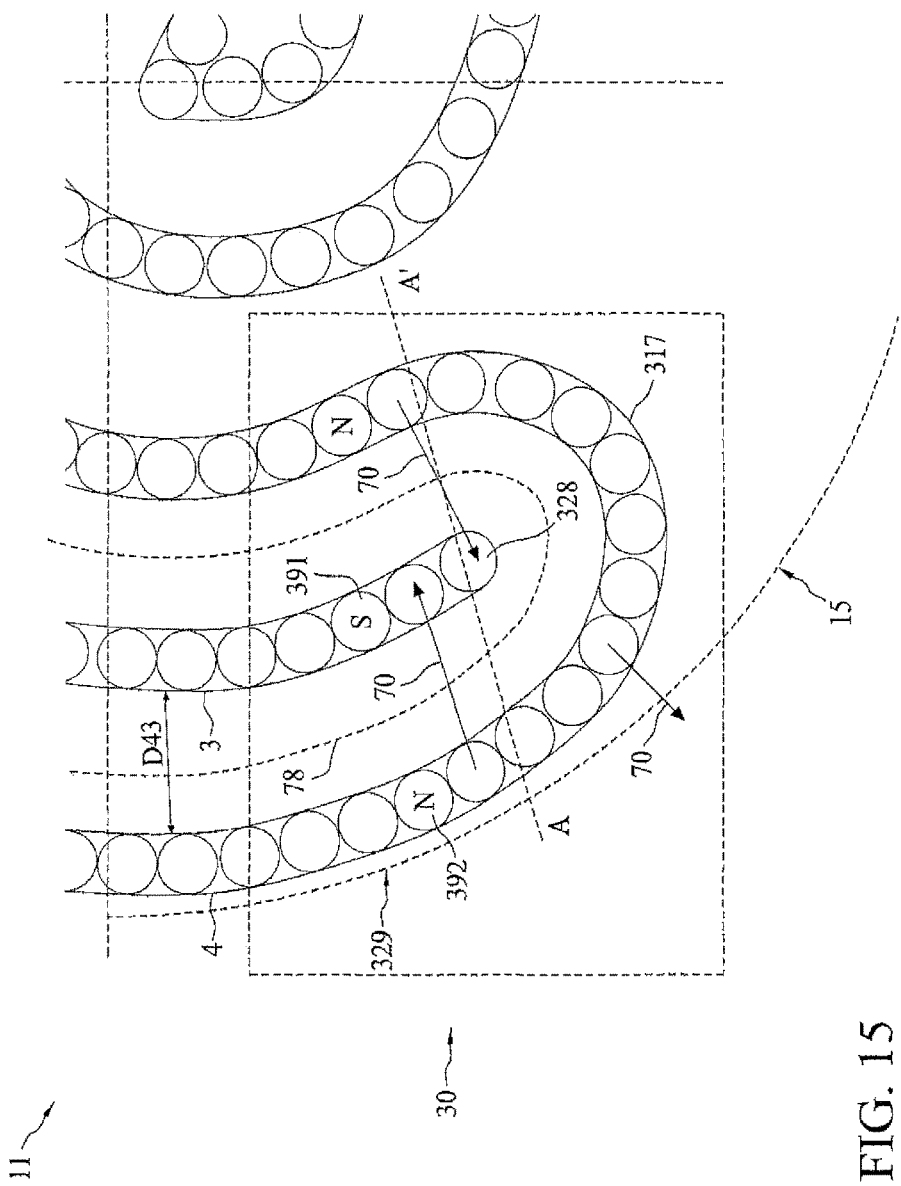

FIG. 15 is a top view similar to FIG. 13, except that FIG. 15 illustrates the predetermine location 78 in the dotted line in a shape of a band. Incident location 78 is conformally surrounding inner pole 3. Incident location 78 is between inner pole 3 and outer pole 4. The recess or grooves resulting from the collisions are proximately around incident location 78. Incident locations 78 maintain substantially a constant distance from inner pole 3.

Figure 16:
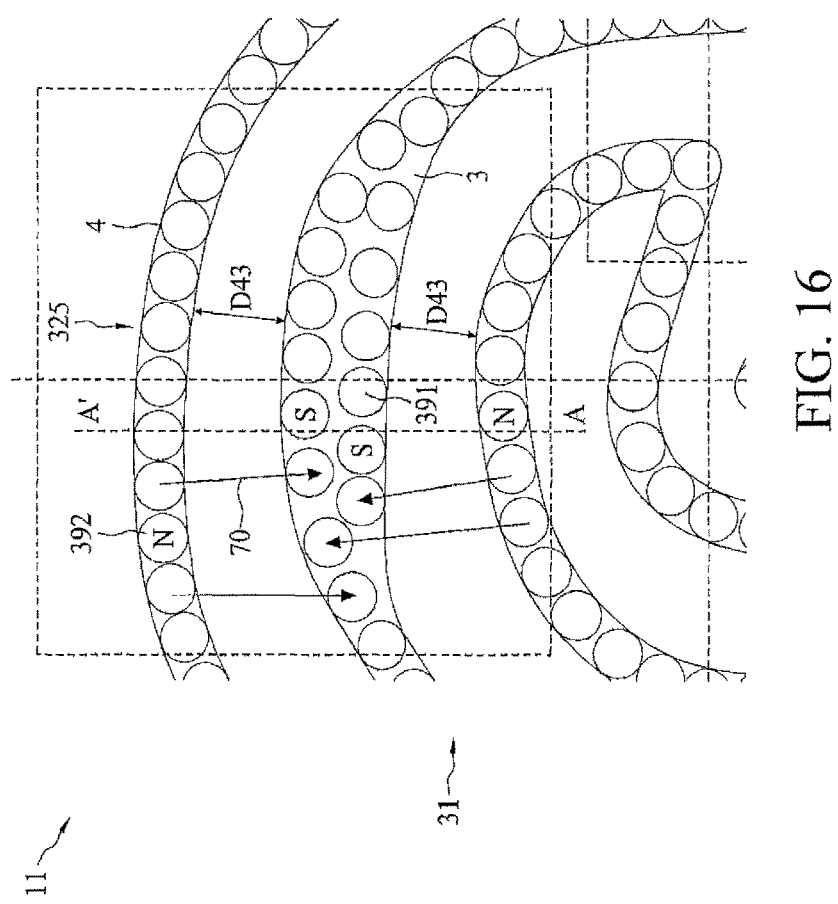

In FIG. 16, section 31 is enlarged from section 31 in FIG. 12. Outer pole 4 includes a magnetic polarity of a north pole 392. Inner pole 3 includes a magnetic polarity of a south pole 391. Magnetic field line 70 crosses from a point of the outer pole 4 to a point of the inner pole 3. Magnetic field lines 70 are pointing from outer pole 4 to inner pole 3. In some embodiments, distances D43 at either side of inner pole 3 are substantially equal. However, in some other embodiments, distances D43 at either side of inner pole 3 are unequal such that length of magnetic field line 70 is substantially unequal on either side. In the latter scenario, plasma is confined differently on either side of inner pole 3.

The shape of inner pole 3 bends conformally with outer pole 4 at middle portion 325. Middle portion 325 includes inner pole 3 and outer pole 4. At middle portion 325, density of magnetic field lines 70 are equally distributed at either side of inner pole 3. Inner pole 3 in middle portion 325 is thicker and incorporates more magnets than that of parallel portion 329 in FIG. 15. The magnets in outer pole 4 are able to match with other magnets on the inner pole 3. An amount of unmatched magnetic pole is fewer in middle portion 325 than in parallel portions 329 such that less magnetic field lines 70 are extending to other direction. Density of magnetic field line 70 around the middle portion 325 is greater than density of magnetic field line 70 around the parallel portion 329 in FIG. 15.

Figure 17:
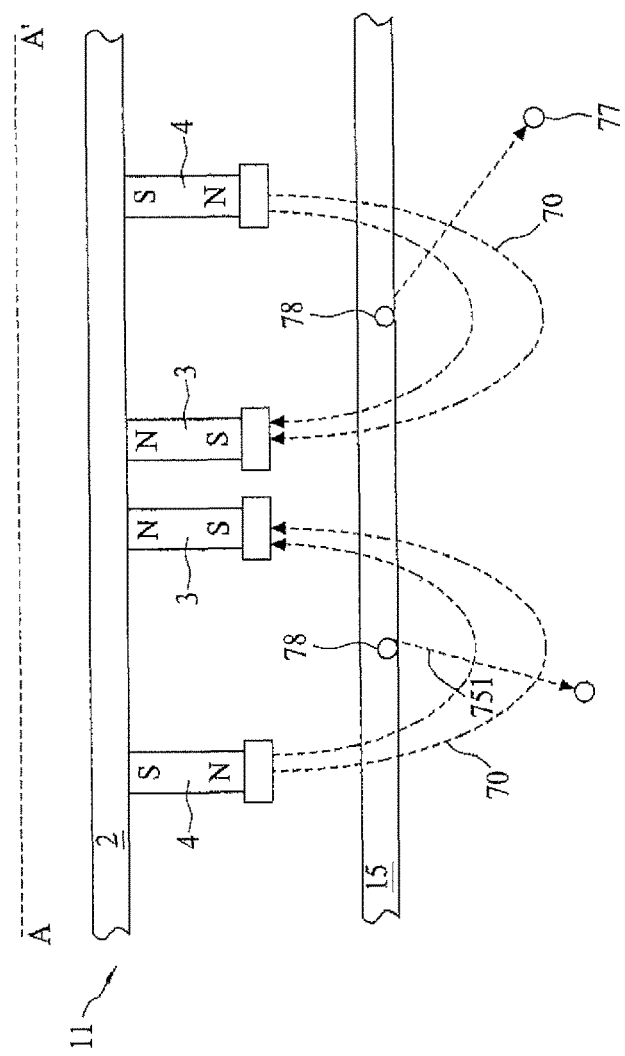

FIG. 17 is a cross sectional view drawn from cross sectional line AA' in FIG. 16. The numbers of magnets in inner pole 3 and outer pole 4 are proximately equal. More magnetic field lines 70 from outer pole 4 extend toward inner pole 3 than magnetic field lines 70 in FIG. 14.

More ions 751 in plasma travel towards inner pole 3 in middle portion 325 than in the parallel portions 329 as illustrated in FIG. 14. More ions 751 collide with target 15 around incident location 78 in middle portion 325 than in the parallel portions 329 in FIG. 14. In FIG. 17, a number of ions 751 hitting on both sides of inner pole 3 are proximately equal. Ions 751 hit target 15 and knock out target material 77 from incident location 78. In some embodiments, more collisions of ions 751 in middle portion 325 than in the parallel portions 329 in FIG. 14 results in more recess or grooves left on target 15 near middle portion 325 than near the parallel portions 329.

Figure 18:
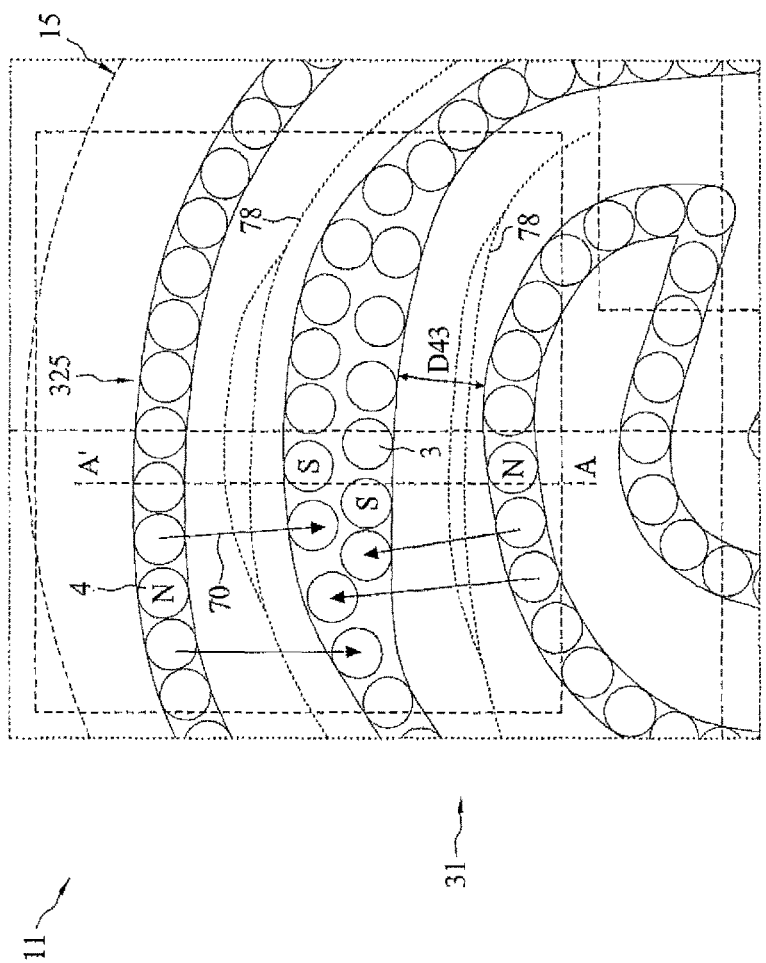

FIG. 18 is a top view of a portion of the magnetron similar to that in FIG. 16, except that FIG. 18 illustrates the incident location 78 in the dotted line between inner pole 3 and outer pole 4. Incident location 78 includes some double dotted lines near middle portion 325 indicating more collisions in middle portion 325 than in the parallel portions 329 in FIG. 15. Density of incident location 78 is increased between inner pole 3 and outer pole 4 around middle portion 325. More recess or grooves are proximately around middle portion 325 than in the parallel portions 329 in FIG. 15. In some embodiments, incident locations 78 on either side of inner pole 3 include different shapes.

Figure 19:
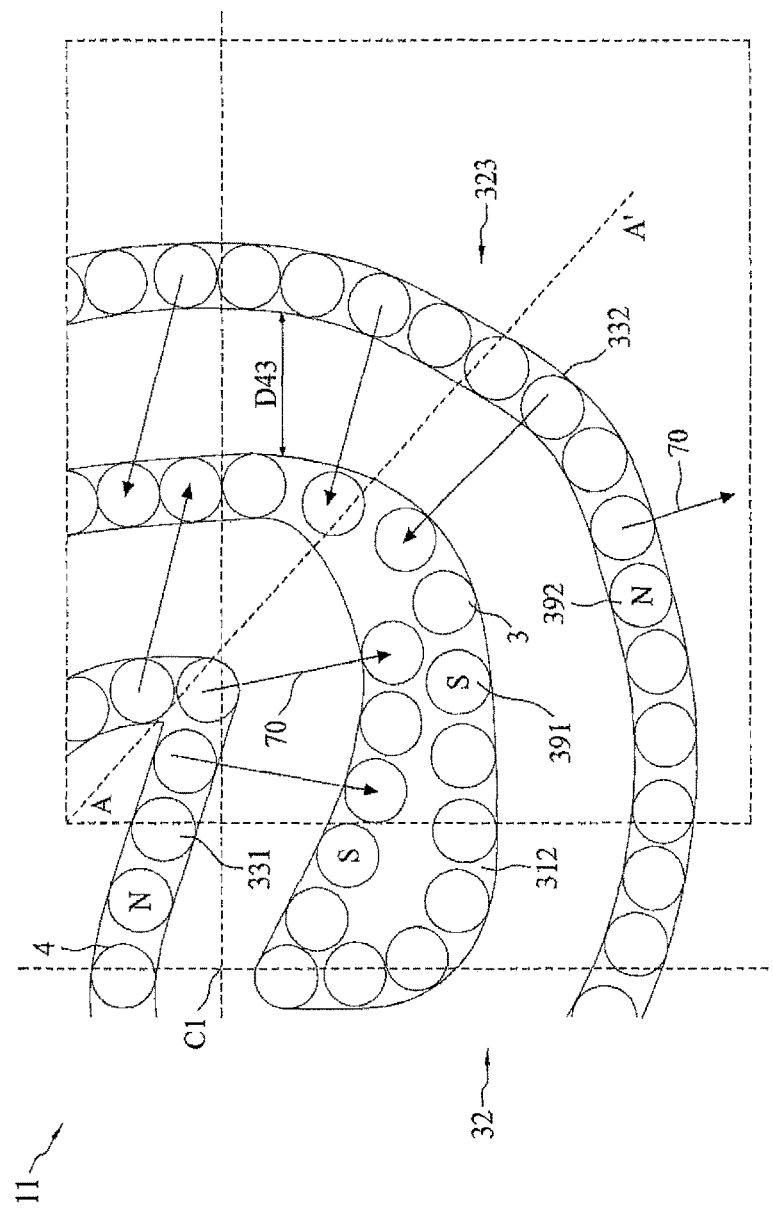

In FIG. 19, section 32 is enlarged from section 32 in FIG. 12. In some embodiments, distances D43 at either side of inner pole 3 are substantially equal. Referring to FIG. 19, inner pole 3 bends conformally with outer pole 4 at about an angle of 90 degree in a corner portion 323. Thickness of inner pole 3 in corner portion 323 is increasing toward terminal portion 312 includes an inner side 331 closer to central axis C1 than an outer side 332. At the corner portion 323, a number of magnets in outer side 332 is substantially greater than a number of magnets in inner side 331. Density of magnetic field lines 70 is larger near outer side 332 of outer pole 4 than near inner side 331 of outer pole 4.

Figure 20:
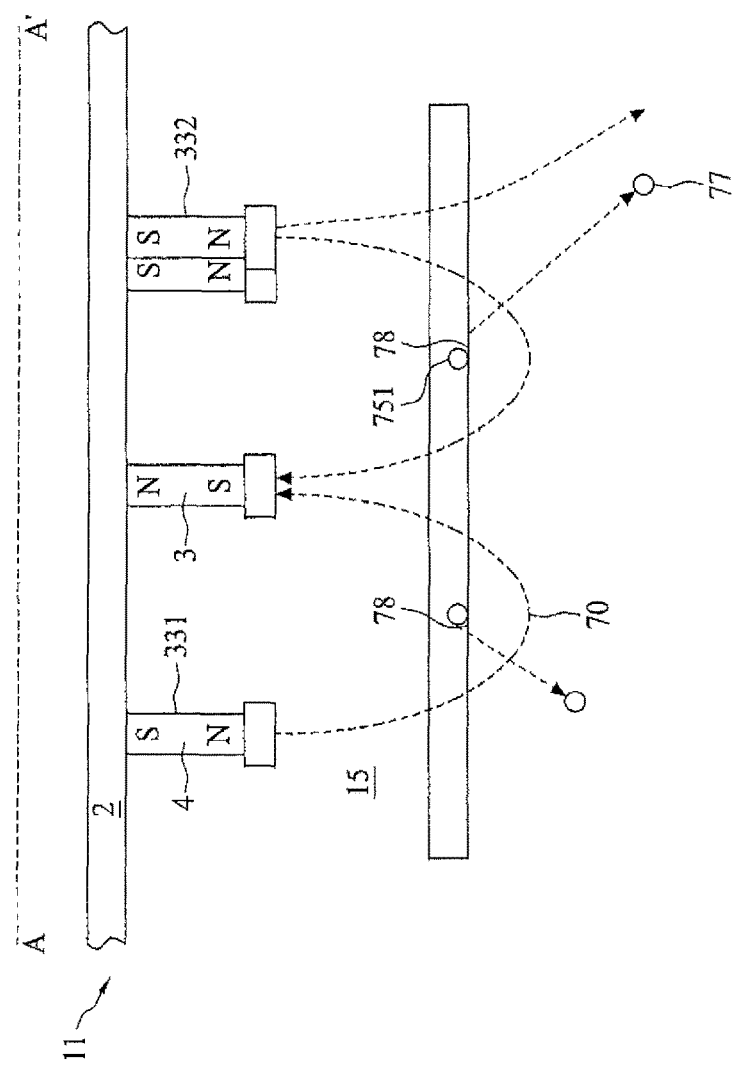

FIG. 20 is a cross sectional view drawn from cross sectional line AA' in FIG. 19. The number of magnets at outer side 332 is substantially greater than the number of magnets at inner side 331 such that more of magnetic field lines 70 extend toward inner pole 3 from outer side 332 of the outer pole 4 than from inner side 331 of the outer pole 4.

More ions 751 in plasma travel towards inner pole 3 from outer side 332 than from inner side 331. More ions 751 hit target 15 around incident location 78 from outer side 332 than from inner side 331. A number of ions 751 hitting on either side of inner pole 3 are substantially different. More collisions of ions 751 in target 15 from outer side 332 than from inner side 331 results in more recess or grooves left on target 15 near outer side 332 of the outer pole 4.

Figure 21:
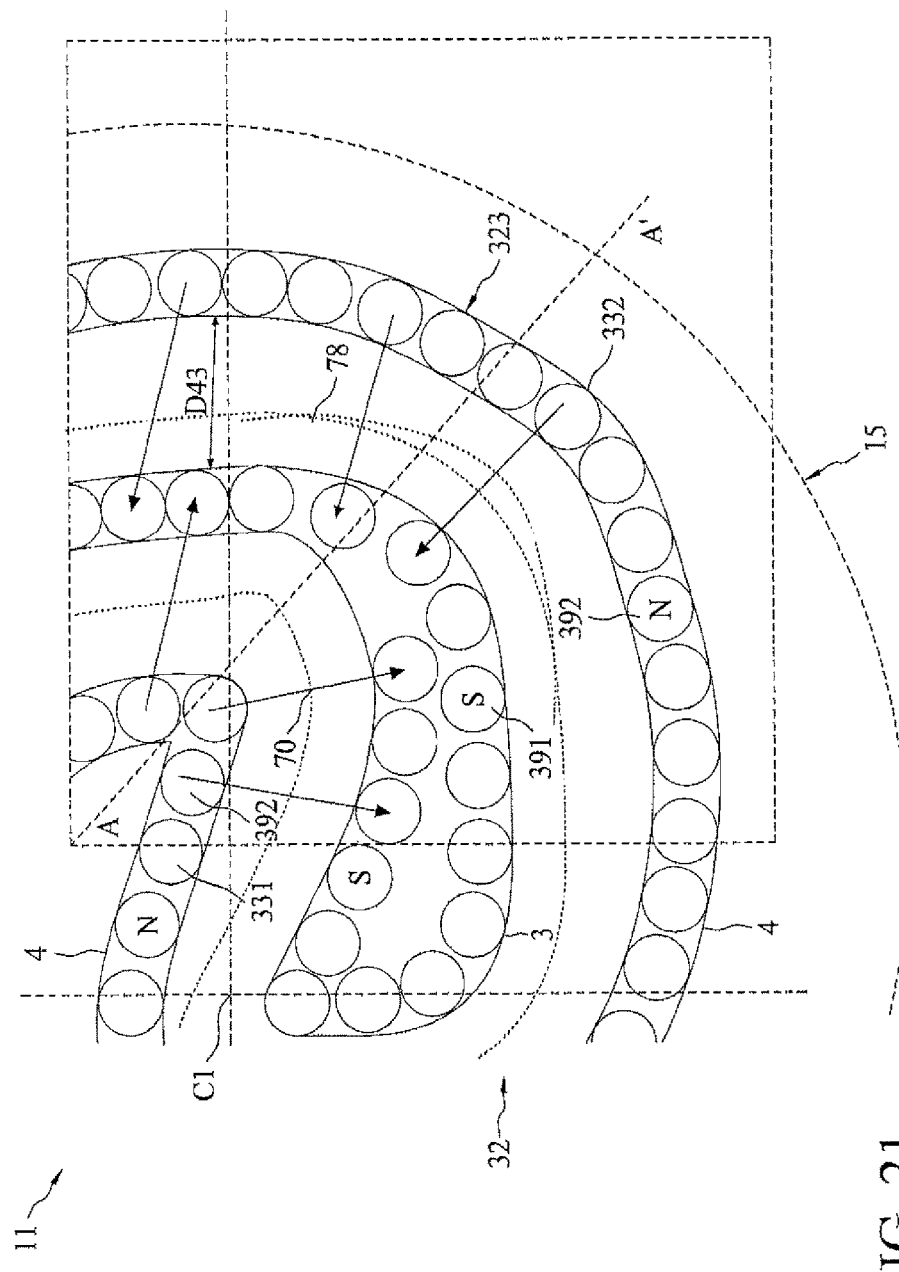

FIG. 21 is a top view of a magnetron structure 11 similar to that shown in FIG. 17, except that FIG. 21 includes incident location 78 illustrated in dotted lines and bent conformally with corner portion 323. Incident location 78 including double dotted lines near corner portion 323 indicates more collisions around corner portion 323 than that at the parallel portions 329 as shown in FIG. 15. Incident locations 78 are distributed more around outer side 332 than around inner side 331. More recess or grooves on the target 15 are proximately near outer side 332 than near inner side 331.

Figure 22:
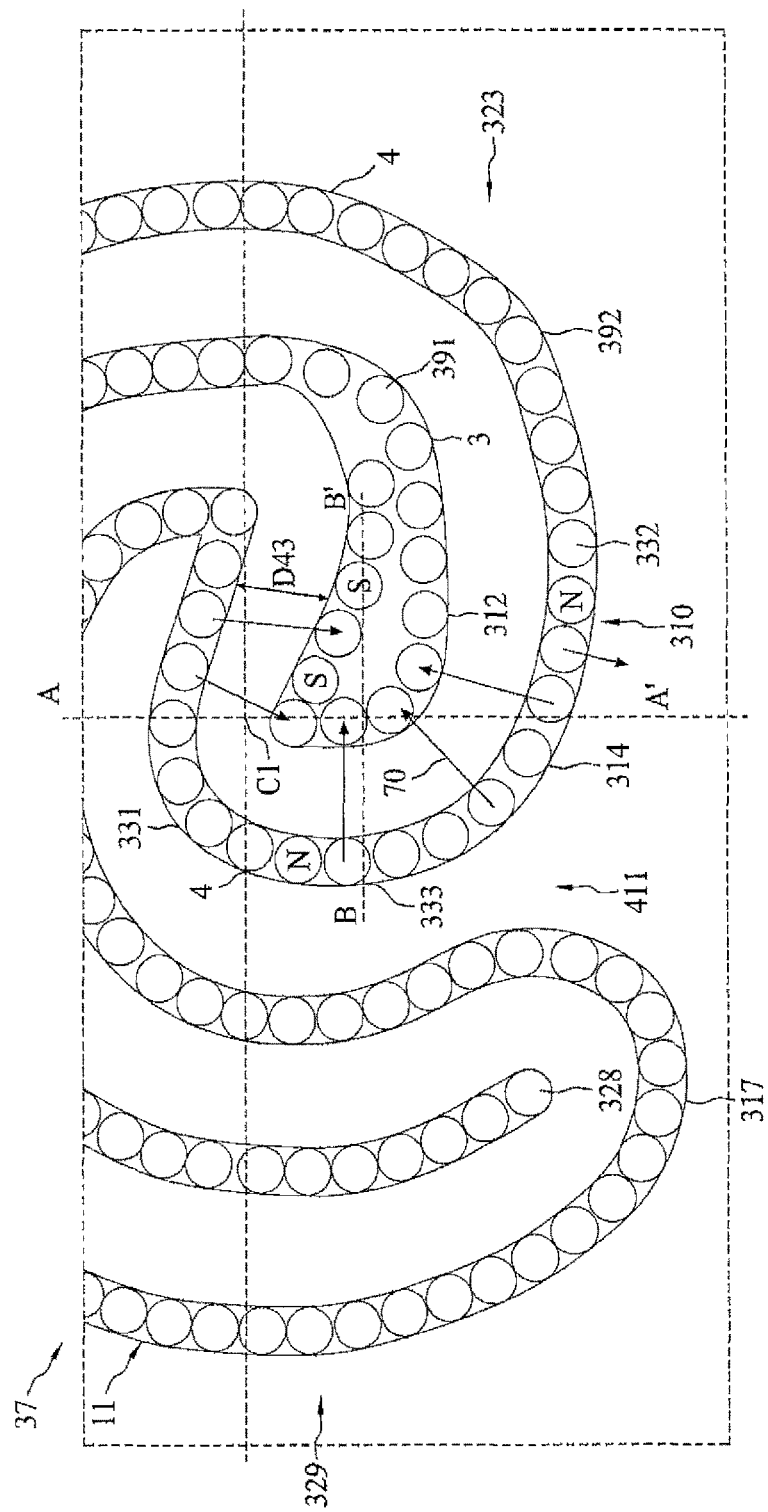

In FIG. 22, section 37 is enlarged from section 32 in FIG. 8. Section 37 includes terminal portion 310 near a central axis C1. Terminal portion 310 includes terminal portion 312 of inner pole 3 and terminal portion 314 of outer pole 4. In some embodiments, distances D43 between terminal portion 312 and terminal portion 314 are substantially equal. Outer pole 4 includes an inner side 331 closer to central axis C1 than an outer side 332. Distances D43 between inner side 331 and terminal portion 312 are substantially equal to distance D43 between outer side 332 and terminal portion 312.

Referring to FIG. 22, terminal portion 312 of the inner pole 3 with increasing thickness is conformal to terminal portion 314 of the outer pole 4. Inner side 331 and outer side 332 of the outer pole 4 are connected at point 333. Point 333 is in proximity to parallel portion 329. An opening 411 of outer pole 4 is between one terminal portion 314 of outer pole 4 and an opposite terminal portion 317 of the magnetron.

Density of magnetic field line 70 between the terminal portion 312 of the inner pole 3 and the outer side 332 is substantially equal to that between the terminal portion 312 and the inner side 331. A cross sectional line AA' is drawn crossing though central axis C1, inner side 331, outer side 332, and terminal portion 312. A cross sectional line BB' is drawn crossing through point 333 and terminal portion 312. Cross sectional line BB' is substantially orthogonal to cross sectional line AA'.

Figure 23:
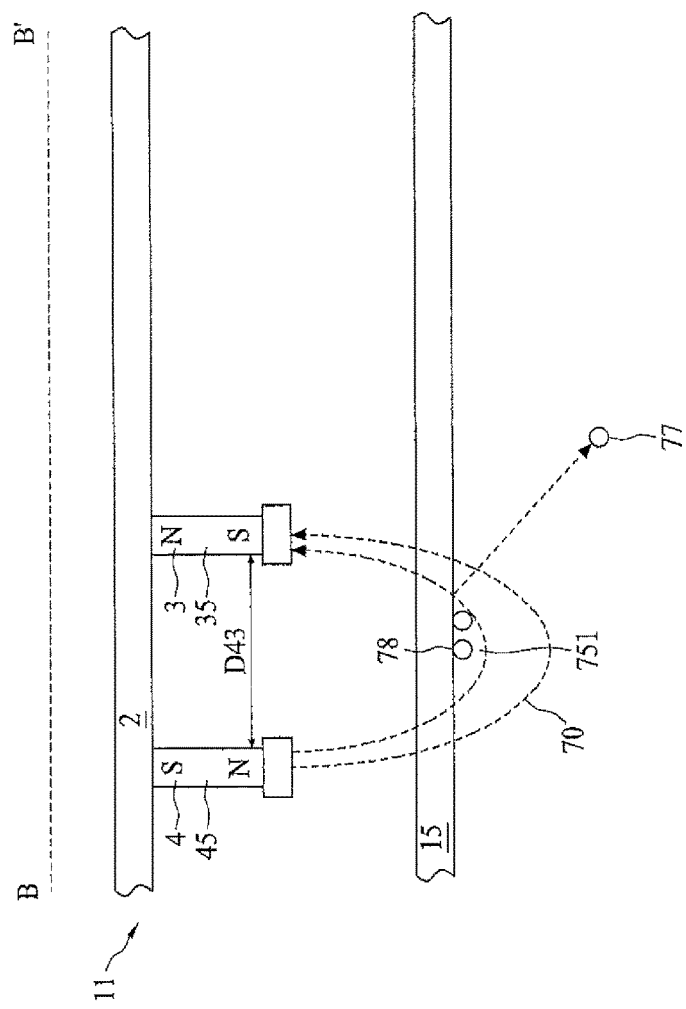

FIG. 23 is a cross sectional view drawn from cross sectional line BB' in FIG. 22. Magnet 45 at outer pole 4 is pairing with magnet 35 at inner pole 3. Magnetic field line 70 couples from magnet 45 to magnet 35.

Figure 24:
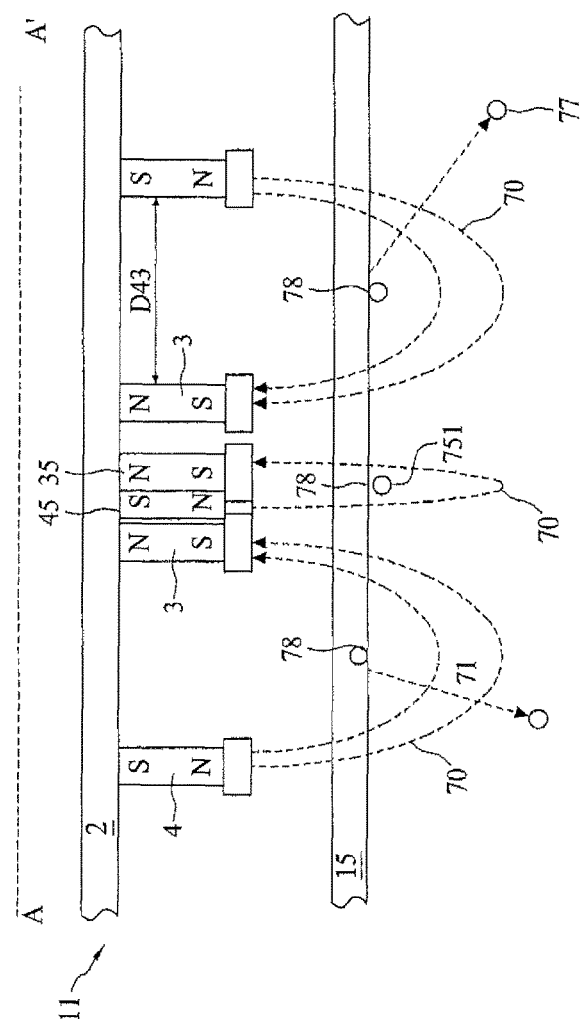

FIG. 24 is a cross sectional view drawn from cross sectional line AA' in FIG. 21. A number of magnets in outer pole 4 is substantially equal to a number of magnets in inner pole 3. A magnet 35 in a middle of inner pole 3 is pairing with magnet 45 as illustrated in FIG. 24. The magnet 45 in outer pole 4 is behind the inner pole 3. Magnetic field line 70 extends from magnet 45 in the outer pole 4 behind magnet 35 to magnet 35 in inner pole 3.

A number of ions 751 colliding at target 15 around terminal portion 312 is substantially larger than the number of ions 751 colliding at target 15 around middle portion 325 as illustrated in FIG. 16 and FIG. 17. More collisions of ions 751 at target 15 around terminal portion 312 than around middle portion 325 results in more recess or grooves left on target 15 near terminal portion 312 than near middle portion 325 in FIG. 16 and FIG. 17.

Figure 25:
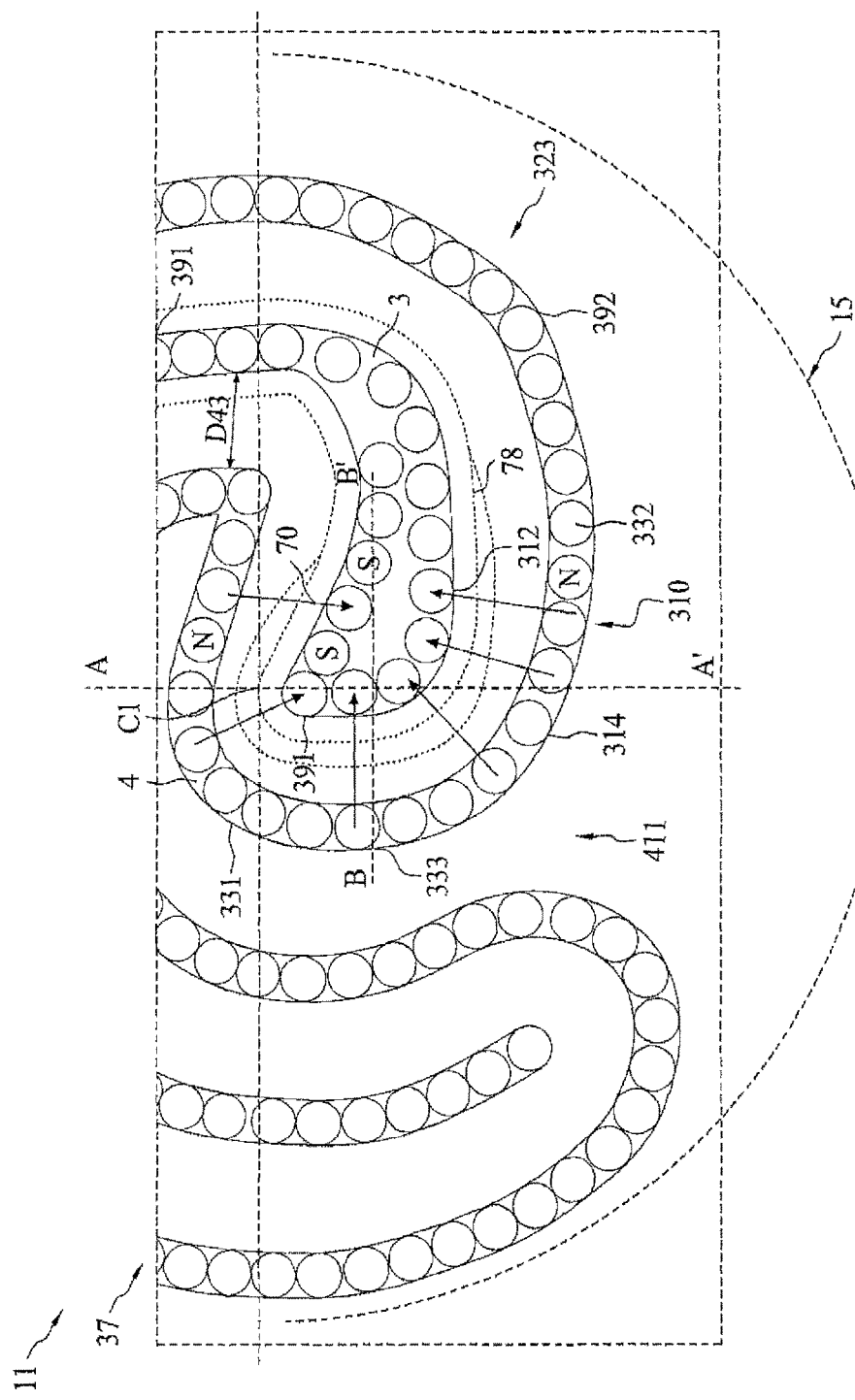

FIG. 25 is a top view of the magnetron similar to that in FIG. 22 except that FIG. 25 illustrates the incident location 78 in the dotted line. Incident location 78 is conformally surrounding the terminal portion 312 of the inner pole 3. Incident location 78 includes some double dotted lines around terminal portion 312, indicating increasing collisions from corner portion 323 toward terminal portion 310.

Figure 26:
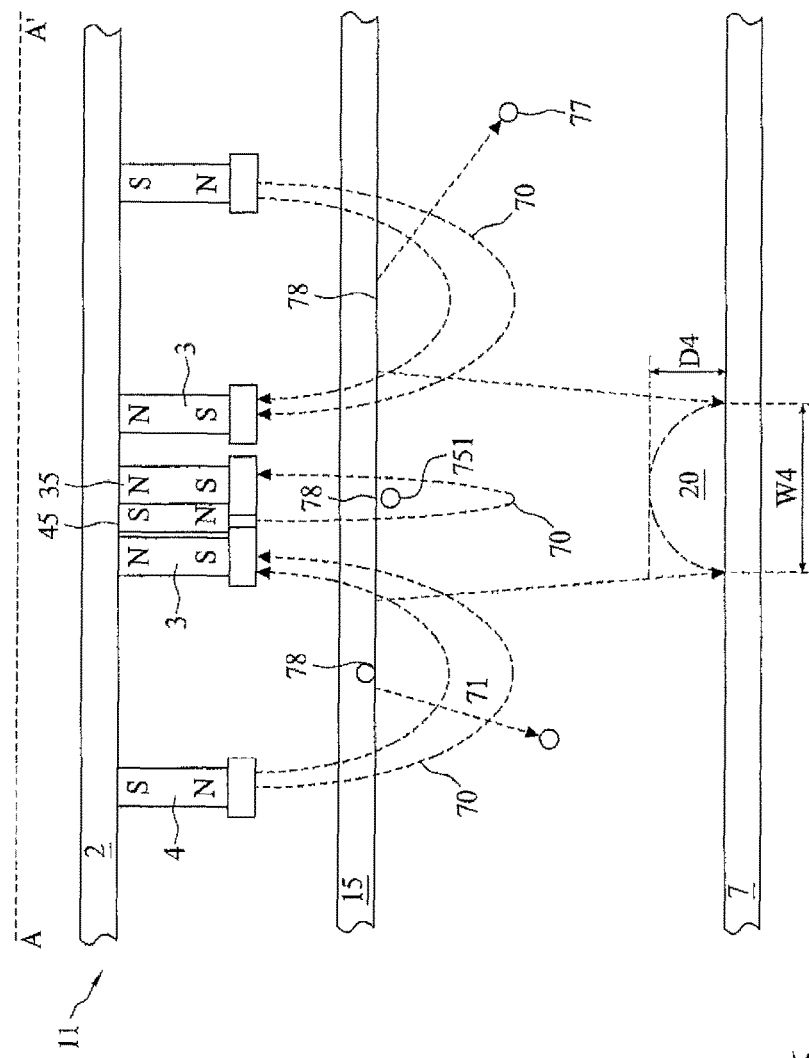

FIG. 26 is a cross sectional view drawn from cross sectional line AA' in FIG. 22. Three magnets from outer pole 4 cause ions 751 collide with target 15 at three incident locations 78 and deposit target material 77 to three regions on top of wafer 7. An overlapping region of the three regions is proximately under inner pole 3. The over lapping region includes a width W4 and a thickness D4.

Figure 27:
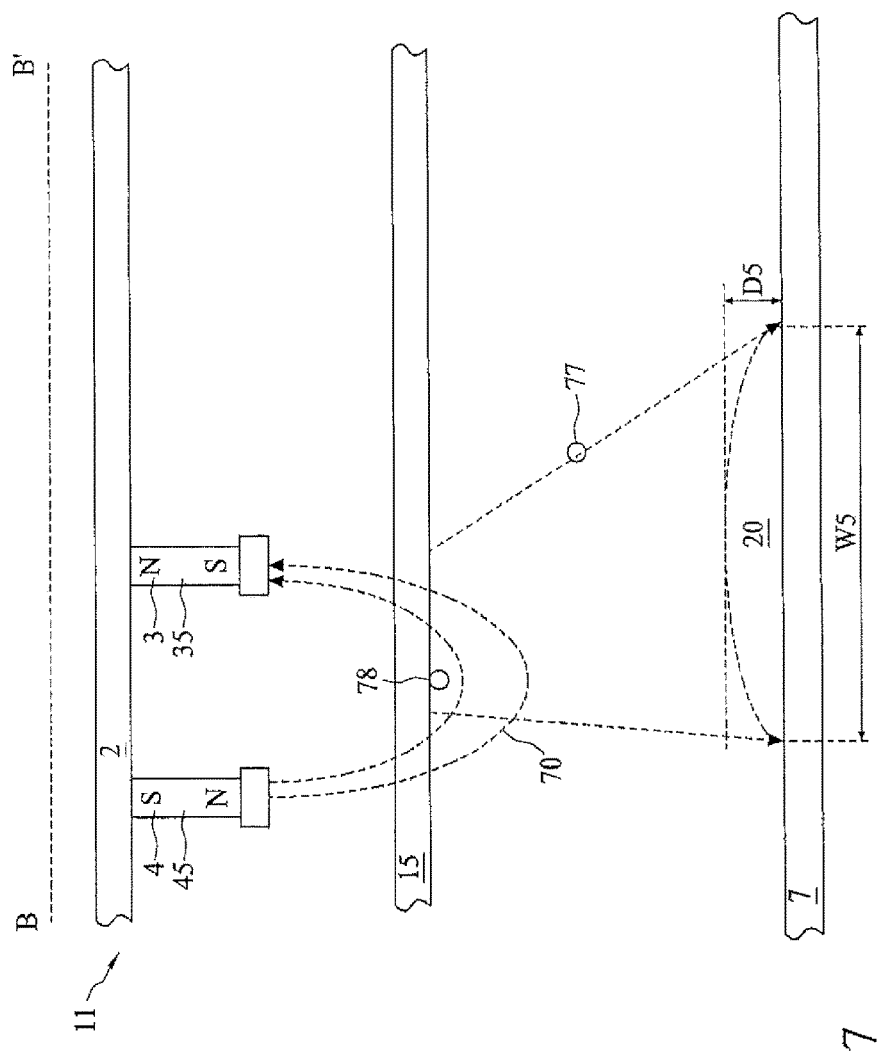

FIG. 27 is a cross sectional view drawn from cross sectional line BB' in FIG. 22. Magnetic field lines 70 cause ions 751 collide with target 15 and deposit target material 77 to a certain region on top of wafer 7.

Figure 28:
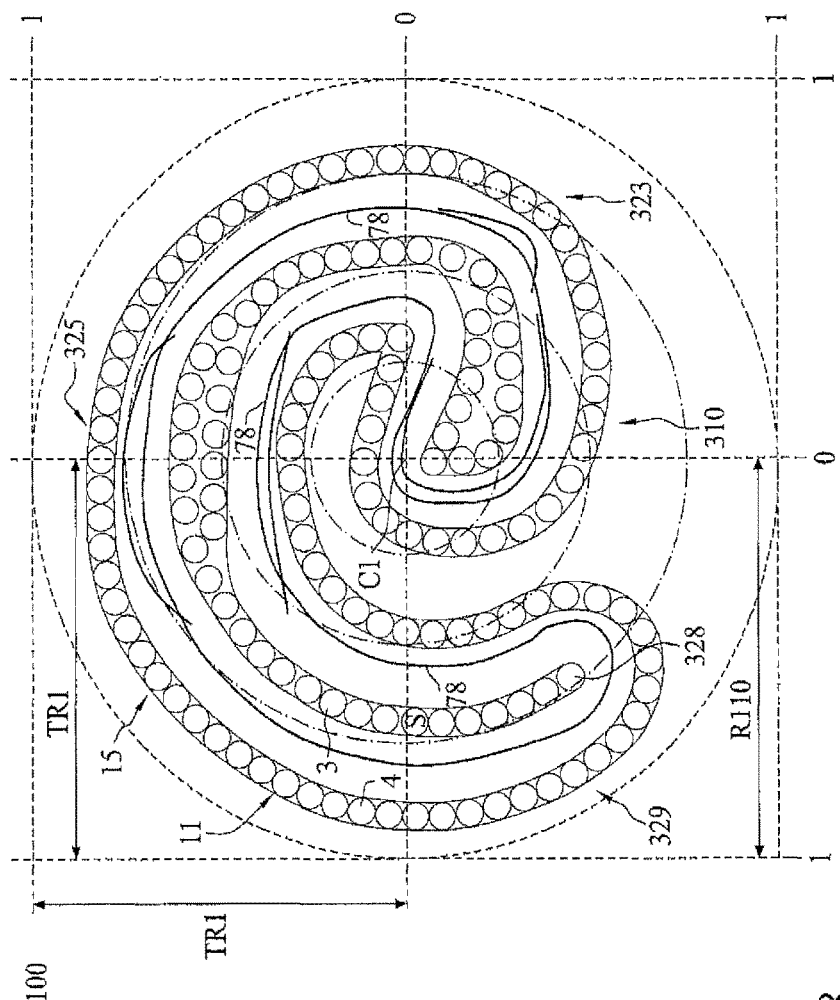
FIGS. 28 to 29 are top views of a target, in accordance with some embodiments of the present disclosure.
Figure 29:
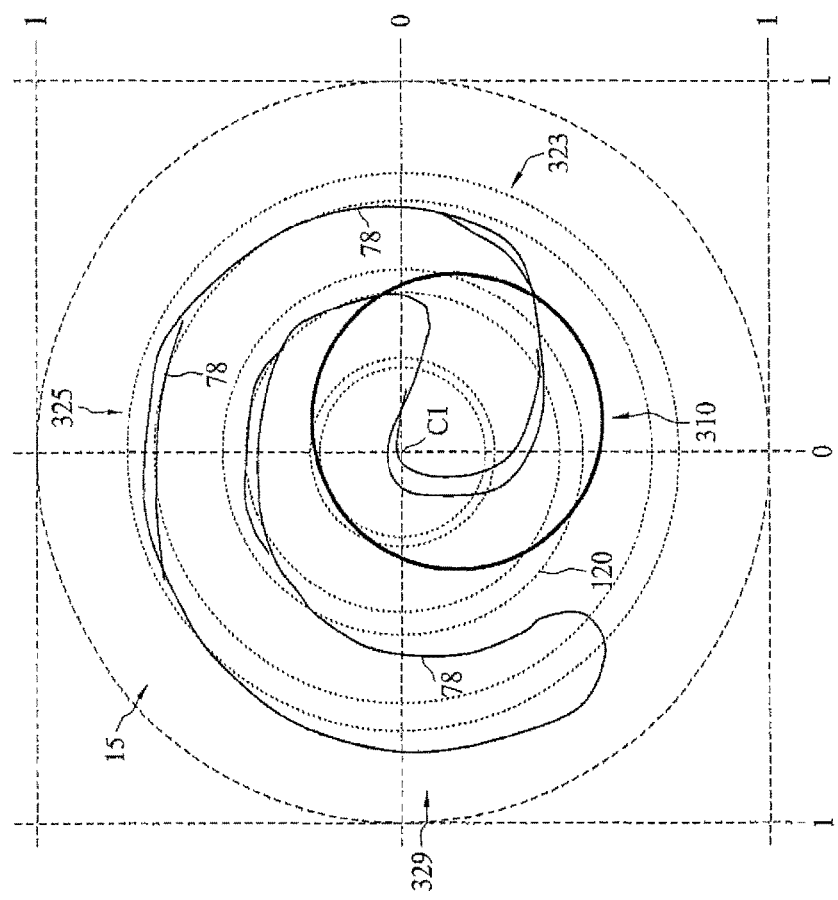

FIGS. 28 and 29 illustrate a combination of incident location 78 from three sections 30, 31, and 32 as illustrated in FIG. 12. In some embodiments, terminal portion 310 is closer to central axis C1 than middle portion 325. In some embodiments, terminal portion 310 is closer to central axis C1 than corner portion 323. In some embodiments, parallel portion 329 is further away from central axis C1 than corner portion 323.

In some embodiments, radius TR1 of target 15 is substantially equal to radius R110 of magnetic structure 11. In some other embodiments, radius TR1 of target 15 is substantially larger than radius R110 of magnetic structure 11.

Figure 30:
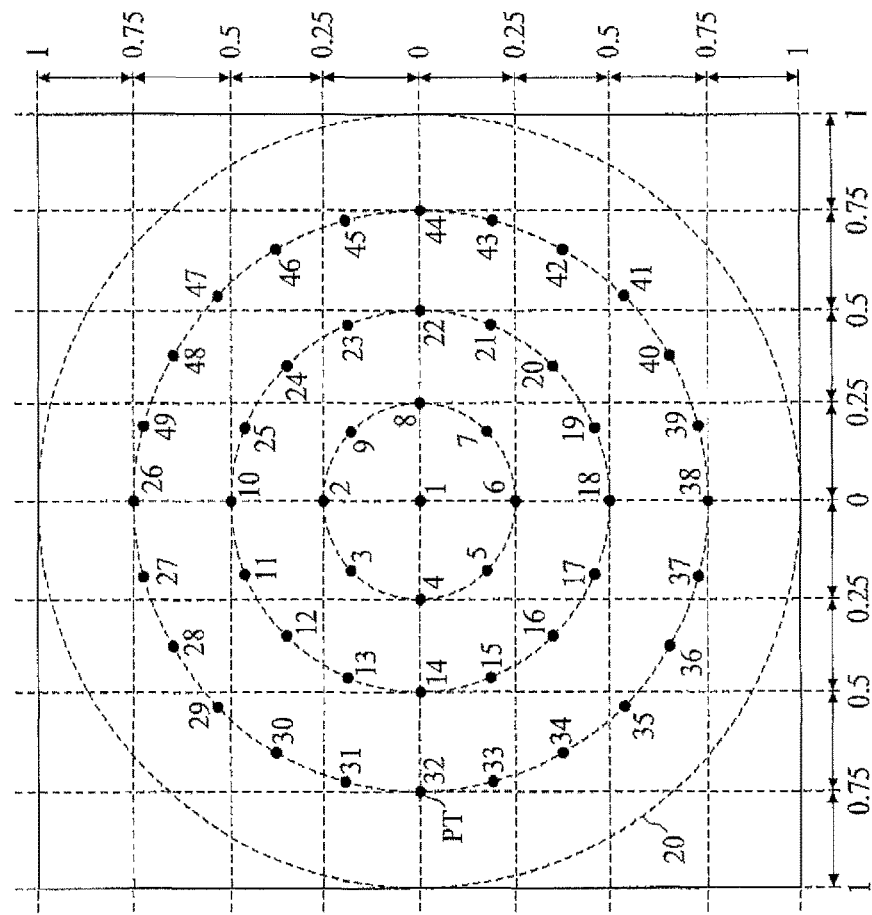
FIG. 30 illustrates distribution of test points, in accordance with some embodiments of the present disclosure.

Referring back to FIG. 12, pattern 100 of magnetron structure 11 in FIG. 12 is adjustable such that sheet resistance and thickness of deposited layers 20 in FIG. 2 are substantially uniform. FIG. 30 illustrates series of test point PT distributed on deposited layer 20.

Figure 31:
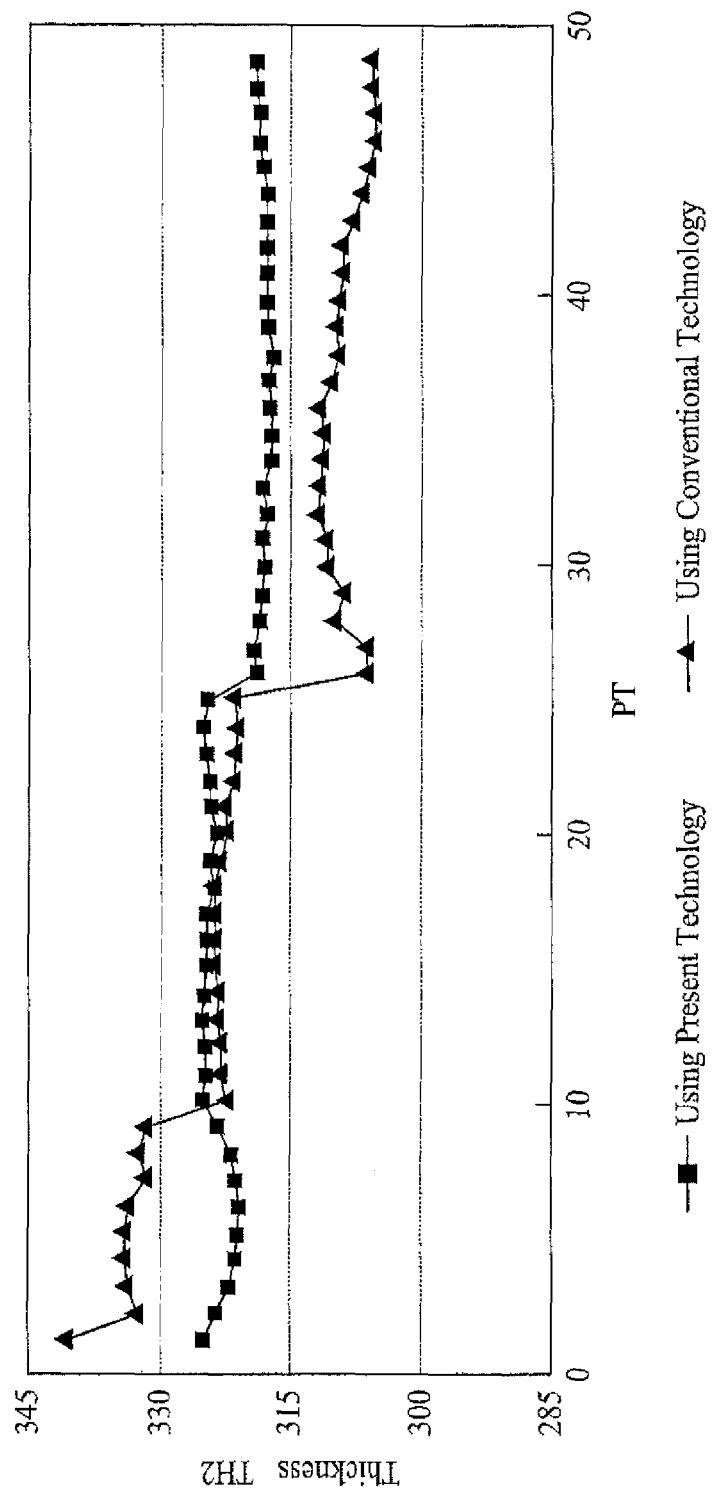
FIG. 31 illustrates a relationship between thickness and test points, in accordance with some embodiments of the present disclosure.

FIG. 31 illustrates thicknesses TH2 measured at each test point PT. FIG. 31 illustrates thickness TH2 deposited by using the present technology is more uniform than thickness TH2 deposited by using a conventional technology.

Figure 32:
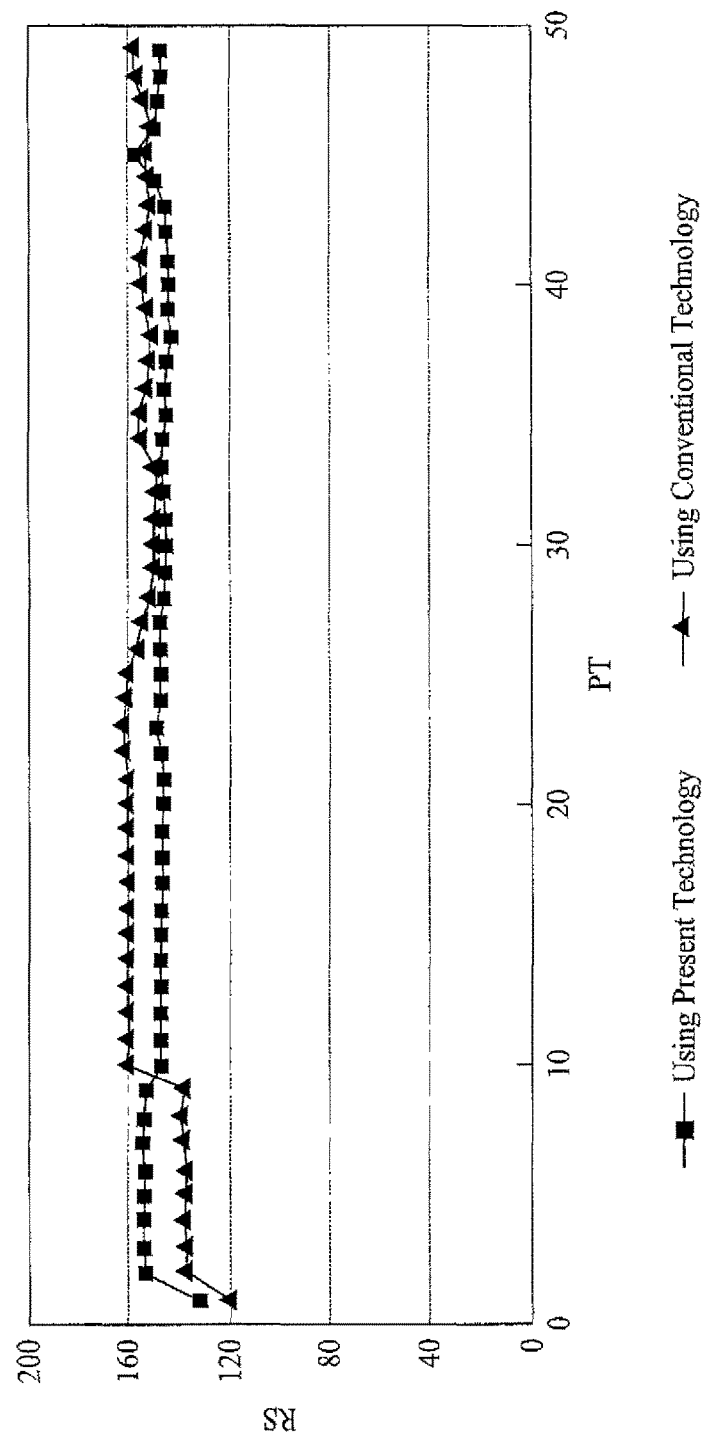
FIG. 32 illustrates a relationship between sheet resistance and test points, in accordance with some embodiments of the present disclosure.

FIG. 32 illustrates sheet resistance (RS) measured at each test point PT. FIG. 32 illustrates sheet resistance (RS) deposited by using the present technology is more uniform than sheet resistance (RS) deposited by using a conventional technology.

Some embodiments of the present disclosure provide a sputtering apparatus includes a magnetron structure configured to erode a target according to a predetermined erosion rate profile symmetric to a central axis of the magnetron structure. The predetermined erosion rate profile includes a first peak rate in proximity to the central axis; and a second peak rate located at about from 0.7 to 0.75 of a radius of the target from the central axis.

In some embodiments of the present disclosure, the magnetron structure includes an outer pole having a first magnetic polarity and an inner pole having a second magnetic polarity opposite to the first magnetic polarity, the inner pole being surrounded by the outer pole.

In some embodiments of the present disclosure, the outer pole and the inner pole of the magnetron structure is arranged in accordance with a predetermined normalized loop length profile, and the predetermined normalized loop length profile comprising a portion of a normalized loop length being substantially constant for about 0.4 of the radius of the target.

In some embodiments of the present disclosure, a normalized loop length transforms from a substantially constant profile to an increasing profile at about 0.4 of the radius of the target.

In some embodiments of the present disclosure, wherein the increasing profile comprises a nonlinear curve beyond 0.4 of the radius of the target.

In some embodiments of the present disclosure, the inner pole includes a terminal portion pointing toward the central axis.

In some embodiments of the present disclosure, a portion of the magnetron structure outside a boundary and being tangential to a circle centering at the central axis is substantially greater than a portion of the magnetron inside the boundary and being tangential to the circle, the boundary enclosing the terminal portion of the inner pole and a terminal portion of the outer pole.

Some embodiments of the present disclosure provide a sputtering apparatus including a magnetron structure. The magnetron structure includes a first portion outside a boundary; and a second portion inside the boundary. An amount of the first portion being tangential to a circle centering at the central axis is substantially greater than an amount of the second portion being tangential to the circle. The magnetron structure is designed to erode a target according to a predetermined profile of erosion rate. The profile includes a first peak rate near the central axis of the magnetron structure; and a second peak rate at about from 0.7 to 0.75 of a radius of the target from the central axis.

In some embodiments of the present disclosure, the profile includes a third peak rate at around 0.5 of a radius of the target from the central axis.

In some embodiments of the present disclosure, the magnetron structure includes an outer pole of a first magnetic polarity in a closed band and an inner pole enclosed by the outer pole with a second magnetic polarity opposite to the first magnetic polarity.

In some embodiments of the present disclosure, the inner pole includes a terminal portion in proximity to the central axis.

In some embodiments of the present disclosure, a distance between the inner pole and the outer pole is substantially constant.

In some embodiments of the present disclosure, the boundary includes a circular shape surrounding the terminal portion of the inner pole.

In some embodiments of the present disclosure, the amount of the second portion being tangential to a circle is approximately constant inside the boundary.

In some embodiments of the present disclosure, the first portion sweeps through more than 270 degree around the central axis.

Some embodiments of the present disclosure provide a method of sputtering. The method includes positioning a wafer at a predetermined distance from a target; rotating a magnetron structure with respect to a central axis; and eroding the target according to a predetermined erosion rate profile. The target near the central axis being eroded at a first rate, the target near from 0.5 to 0.55 of a radius thereof being eroded at about 0.5 of the first rate; and the target near from 0.7 to 0.75 of the radius thereof being eroded at about 1.1 of the first rate.

In some embodiments of the present disclosure, further includes forming the magnetron structure with an outer pole of a first magnetic polarity having a closed loop and an inner pole enclosed by the outer pole, and the inner pole including a second magnetic polarity opposite to the first magnetic polarity.

In some embodiments of the present disclosure, the positioning the wafer at a predetermined distance from a target including positioning the wafer from about 40 to 70 millimeter from the target.

In some embodiments of the present disclosure, the target includes titanium nitride.

In some embodiments of the present disclosure, the magnetron structure is formed to have a first portion outside a boundary and a second portion inside the boundary. An amount of the first portion being tangential to a circle centering at the central axis is substantially greater than an amount of the second portion being tangential to the circle.

In some embodiments of the present disclosure, the boundary includes a shape of a circle and encloses the central axis and terminal portions of the inner pole and the outer pole.

In some embodiments of the present disclosure, the boundary includes a radius in a range of from about 70 mm to about 80 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sputtering apparatus, comprising:
a magnetron structure including an outer pole and an inner pole, configured to erode a target according to a predetermined erosion rate profile symmetric to a central axis of the magnetron structure, wherein:

the outer pole and the inner pole of the magnetron structure are arranged in accordance with a predetermined normalized loop length profile, the predetermined normalized loop length profile includes a portion of a normalized loop length being substantially constant for about 0.4 of a radius of the target from the central axis, and the predetermined erosion rate profile includes:
a first peak rate in proximity to the central axis; and
a second peak rate located at about from 0.7 to 0.75 of the radius of the target from the central axis, the first peak rate being substantially equal to the second peak rate.

2. The apparatus of claim 1, wherein the outer pole has a first magnetic polarity and the inner pole has a second magnetic polarity opposite to the first magnetic polarity, the inner pole being surrounded by the outer pole.

3. The apparatus of claim 1, wherein the normalized loop length transforms from a substantially constant profile to an increasing profile at about 0.4 of the radius of the target.

4. The apparatus of claim 3, wherein the increasing profile comprises a nonlinear curve beyond 0.4 of the radius of the target.

5. The apparatus of claim 2, wherein the inner pole comprises a terminal portion pointing toward the central axis.

6. The apparatus of claim 5, wherein a portion of the magnetron structure outside a boundary and being tangential to a circle centering at the central axis is substantially greater than a portion of the magnetron inside the boundary and being tangential to the circle, the boundary enclosing the terminal portion of the inner pole and a terminal portion of the outer pole.

7. A sputtering apparatus, comprising:
a magnetron structure, comprising:
a first portion outside a boundary;
a second portion inside the boundary; and
an outer pole and an inner pole,
wherein:
an amount of the first portion being tangential to a circle centering at a central axis is substantially greater than an amount of the second portion being tangential to the circle,
the inner and outer poles are arranged in accordance with a predetermined normalized loop length profile that has a portion of a normalized loop length being substantially constant for about 0.4 of a radius of a target from the central axis, and
the magnetron structure is configured to erode the target according to a predetermined profile of erosion rate that includes:
a first peak rate near the central axis of the magnetron structure; and
a second peak rate at about from 0.7 to 0.75 of the radius of the target from the central axis.

8. The apparatus of claim 7, wherein the profile includes a third peak rate at around 0.5 of the radius of the target from the central axis.

9. The apparatus of claim 7, wherein the outer pole of a first magnetic polarity is arranged in a closed band and, the inner pole enclosed by the outer pole includes a second magnetic polarity opposite to the first magnetic polarity.

10. The apparatus of claim 9, wherein the inner pole comprises a terminal portion in proximity to the central axis.

11. The apparatus of claim 9, wherein a distance between the inner pole and the outer pole is substantially constant.

12. The apparatus of claim 10, wherein the boundary comprises a circular shape surrounding the terminal portion of the inner pole.

13. The apparatus of claim 7, wherein the amount of the second portion being tangential to a circle is approximately constant inside the boundary.

14. The apparatus of claim 12, wherein the first portion sweeps through more than 270 degrees around the central axis.

15. A method of sputtering, comprising:
positioning a wafer at a predetermined distance from a target;
rotating a magnetron structure with respect to a central axis, wherein:
the magnetron structure includes an outer pole and an inner pole that are arranged in accordance with a predetermined normalized loop length profile, and
the predetermined normalized loop length profile includes a portion of a normalized loop length being substantially constant for about 0.4 of a radius of the target from the central axis; and
eroding the target according to a predetermined erosion rate profile, the target on the central axis being eroded at a first rate, the target near from 0.5 to 0.55 of the radius thereof being eroded at about 0.5 of the first rate; and the target near from 0.7 to 0.75 of the radius thereof being eroded at about 1.1 of the first rate.

16. The method of claim 15, wherein the outer pole of a first magnetic polarity has a closed loop, the inner pole is enclosed by the outer pole, and the inner pole includes a second magnetic polarity opposite to the first magnetic polarity.

17. The method of claim 16, wherein positioning the wafer at the predetermined distance from the target includes: positioning the wafer from about 40 millimeters to 70 millimeters from the target.

18. The method of claim 15, wherein the target comprises titanium nitride.

19. The method of claim 16, wherein: the magnetron structure is configured to have a first portion outside a boundary and a second portion inside the boundary, and an amount of the first portion being tangential to a circle centering at the central axis is substantially greater than an amount of the second portion being tangential to the circle.

20. The method of claim 19, wherein the boundary comprises a shape of a circle and encloses the central axis and terminal portions of the inner pole and the outer pole.

21. The method of claim 20, wherein the boundary comprises a radius in a range of from about 70 mm to about 80 mm.

* * * * *